United States Patent
Kataya et al.

(10) Patent No.: US 8,360,325 B2
(45) Date of Patent: Jan. 29, 2013

(54) WIRELESS IC DEVICE, ELECTRONIC APPARATUS, AND METHOD FOR ADJUSTING RESONANT FREQUENCY OF WIRELESS IC DEVICE

(75) Inventors: Takeshi Kataya, Ritto (JP); Noboru Kato, Moriyama (JP); Satoshi Ishino, Kusatsu (JP); Nobuo Ikemoto, Moriyama (JP); Ikuhei Kimura, Nara (JP); Koji Shiroki, Echizen (JP); Yuya Dokai, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 145 days.

(21) Appl. No.: 12/861,945

(22) Filed: Aug. 24, 2010

(65) Prior Publication Data

US 2010/0308118 A1    Dec. 9, 2010

Related U.S. Application Data

(63) Continuation of application No. PCT/JP2009/057482, filed on Apr. 14, 2009.

(30) Foreign Application Priority Data

Apr. 14, 2008    (JP) .................................. 2008-104955

(51) Int. Cl.
*G06K 19/06* (2006.01)
*G06K 19/00* (2006.01)
*H01Q 1/38* (2006.01)
*H01Q 9/28* (2006.01)

(52) U.S. Cl. . 235/492; 235/375; 235/487; 343/700 MS; 343/795; 343/873; 257/532; 257/735

(58) Field of Classification Search .................. 235/375, 235/492, 487, 924; 343/700 MS, 795, 873; 257/532, 735
See application file for complete search history.

(56) References Cited

U.S. PATENT DOCUMENTS

| | | | |
|---|---|---|---|
| 3,364,564 A | 1/1968 | Kurtz et al. |
| 4,794,397 A | 12/1988 | Ohe et al. |
| 5,232,765 A | 8/1993 | Yano et al. |
| 5,253,969 A | 10/1993 | Richert |
| 5,337,063 A | 8/1994 | Takahira |

(Continued)

FOREIGN PATENT DOCUMENTS

| | | |
|---|---|---|
| CN | 1855613 A | 11/2006 |
| DE | 10 2006 057 369 A1 | 6/2008 |

(Continued)

OTHER PUBLICATIONS

Official Communication issued in International Patent Application No. PCT/JP2008/063025, mailed on Aug. 12, 2008.

(Continued)

*Primary Examiner* — Michael G Lee
*Assistant Examiner* — Laura Gudorf
(74) *Attorney, Agent, or Firm* — Keating & Bennett, LLP

(57) ABSTRACT

A wireless IC device and an electronic apparatus are obtained, which can achieve miniaturization and improve the gain of a radiator plate (electrode) without providing a dedicated antenna. A wireless IC device is provided, in which a loop electrode is provided in a ground electrode provided on a printed wiring circuit board, and in which a wireless IC chip that processes a transmission/reception signal or an electromagnetic coupling module is coupled to the loop electrode. The ground electrode is coupled to the wireless IC chip or the electromagnetic coupling module via the loop electrode, and transmits or receives a high-frequency signal. The ground electrode is formed with a slit for adjusting a resonant frequency thereof.

22 Claims, 19 Drawing Sheets

U.S. PATENT DOCUMENTS

| | | |
|---|---|---|
| 5,374,937 A | 12/1994 | Tsunekawa et al. |
| 5,399,060 A | 3/1995 | Richert |
| 5,491,483 A | 2/1996 | D'Hont |
| 5,528,222 A | 6/1996 | Moskowitz et al. |
| 5,757,074 A | 5/1998 | Matloubian et al. |
| 5,854,480 A | 12/1998 | Noto |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |
| 6,104,311 A | 8/2000 | Lastinger |
| 6,107,920 A | 8/2000 | Eberhardt et al. |
| 6,172,608 B1 | 1/2001 | Cole |
| 6,181,287 B1 | 1/2001 | Beigel |
| 6,190,942 B1 | 2/2001 | Wilm et al. |
| 6,249,258 B1 | 6/2001 | Bloch et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,812,707 B2 | 11/2004 | Yonezawa et al. |
| 6,828,881 B2 | 12/2004 | Mizutani et al. |
| 6,837,438 B1 | 1/2005 | Takasugi et al. |
| 6,861,731 B2 | 3/2005 | Buijsman et al. |
| 6,927,738 B2 | 8/2005 | Senba et al. |
| 6,963,729 B2 | 11/2005 | Uozumi |
| 7,088,249 B2 | 8/2006 | Senba et al. |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 2002/0011967 A1 | 1/2002 | Goff et al. |
| 2002/0015002 A1 | 2/2002 | Yasukawa et al. |
| 2002/0044092 A1 | 4/2002 | Kushihi |
| 2002/0067316 A1 | 6/2002 | Yokoshima et al. |
| 2002/0093457 A1 | 7/2002 | Hamada et al. |
| 2002/0175873 A1 | 11/2002 | King et al. |
| 2003/0006901 A1 | 1/2003 | Kim et al. |
| 2003/0020661 A1 | 1/2003 | Sato |
| 2003/0045324 A1 | 3/2003 | Nagumo et al. |
| 2003/0169153 A1 | 9/2003 | Muller |
| 2004/0001027 A1 | 1/2004 | Killen et al. |
| 2004/0026519 A1 | 2/2004 | Usami et al. |
| 2004/0056823 A1 | 3/2004 | Zuk et al. |
| 2004/0066617 A1 | 4/2004 | Hirabayashi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2004/0252064 A1 | 12/2004 | Yuanzhu |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0134460 A1 | 6/2005 | Usami |
| 2005/0134506 A1 | 6/2005 | Egbert |
| 2005/0138798 A1 | 6/2005 | Sakama et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0275539 A1 | 12/2005 | Sakama et al. |
| 2006/0001138 A1 | 1/2006 | Sakama et al. |
| 2006/0044192 A1 | 3/2006 | Egbert |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0145872 A1 | 7/2006 | Tanaka et al. |
| 2006/0158380 A1 | 7/2006 | Son et al. |
| 2006/0170606 A1 | 8/2006 | Yamagajo et al. |
| 2006/0214801 A1 | 9/2006 | Murofushi et al. |
| 2006/0220871 A1 | 10/2006 | Baba et al. |
| 2006/0244676 A1 | 11/2006 | Uesaka |
| 2006/0255886 A1 | 11/2006 | Ninomiya et al. |
| 2006/0267138 A1* | 11/2006 | Kobayashi ............... 257/531 |
| 2007/0004028 A1 | 1/2007 | Lair et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0057854 A1 | 3/2007 | Oodachi et al. |
| 2007/0069037 A1 | 3/2007 | Kawai |
| 2007/0132591 A1 | 6/2007 | Khatri |
| 2007/0164414 A1 | 7/2007 | Dokai et al. |
| 2007/0171139 A1* | 7/2007 | King et al. ............... 343/767 |
| 2007/0200782 A1* | 8/2007 | Hayama et al. ........... 343/795 |
| 2007/0252700 A1 | 11/2007 | Ishihara et al. |
| 2007/0252703 A1 | 11/2007 | Kato et al. |
| 2007/0285254 A1* | 12/2007 | Usami ..................... 340/572.7 |
| 2007/0285335 A1 | 12/2007 | Bungo et al. |
| 2007/0290928 A1* | 12/2007 | Chang et al. ......... 343/700 MS |
| 2008/0024156 A1 | 1/2008 | Arai et al. |
| 2008/0087990 A1 | 4/2008 | Kato et al. |
| 2008/0169905 A1 | 7/2008 | Slatter |
| 2008/0238783 A1* | 10/2008 | Wong et al. .......... 343/700 MS |
| 2008/0272885 A1 | 11/2008 | Atherton |
| 2009/0002130 A1 | 1/2009 | Kato |
| 2009/0009007 A1 | 1/2009 | Kato et al. |
| 2009/0065594 A1 | 3/2009 | Kato et al. |
| 2009/0109102 A1 | 4/2009 | Dokai et al. |
| 2009/0262041 A1 | 10/2009 | Ikemoto et al. |

FOREIGN PATENT DOCUMENTS

| | | |
|---|---|---|
| EP | 0 694 874 A2 | 1/1996 |
| EP | 0 977 145 A2 | 2/2000 |
| EP | 1 010 543 A1 | 6/2000 |
| EP | 1 160 915 A2 | 12/2001 |
| EP | 1 170 795 A2 | 1/2002 |
| EP | 1 227 540 A1 | 7/2002 |
| EP | 1 280 232 A1 | 1/2003 |
| EP | 1 343 223 A1 | 9/2003 |
| EP | 1 357 511 A2 | 10/2003 |
| EP | 1 548 872 A1 | 6/2005 |
| EP | 1 703 589 A1 | 9/2006 |
| EP | 1 841 005 A1 | 10/2007 |
| EP | 2 009 738 A1 | 12/2008 |
| EP | 2 148 449 A1 | 1/2010 |
| GB | 2 305 075 A | 3/1997 |
| JP | 50-143451 A | 11/1975 |
| JP | 62-127140 U | 8/1987 |
| JP | 02-164105 A | 6/1990 |
| JP | 03-262313 A | 11/1991 |
| JP | 04-150011 A | 5/1992 |
| JP | 04-167500 A | 6/1992 |
| JP | 05-327331 A | 12/1993 |
| JP | 6-53733 A | 2/1994 |
| JP | 06-077729 A | 3/1994 |
| JP | 06-177635 A | 6/1994 |
| JP | 6-260949 A | 9/1994 |
| JP | 07-183836 A | 7/1995 |
| JP | 08-056113 A | 2/1996 |
| JP | 8-87580 A | 4/1996 |
| JP | 08-088586 A | 4/1996 |
| JP | 11-149537 A | 6/1996 |
| JP | 08-176421 A | 7/1996 |
| JP | 08-180160 A | 7/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-035025 A | 2/1997 |
| JP | 9-93029 A | 4/1997 |
| JP | 09-245381 A | 9/1997 |
| JP | 09-252217 A | 9/1997 |
| JP | 09-270623 A | 10/1997 |
| JP | 9-512367 A | 12/1997 |

| | | | | | | |
|---|---|---|---|---|---|---|
| JP | 10-069533 | A | 3/1998 | JP | 2002-280821 A | 9/2002 |
| JP | 10-505466 | A | 5/1998 | JP | 2002-298109 A | 10/2002 |
| JP | 10-171954 | A | 6/1998 | JP | 2002-308437 A | 10/2002 |
| JP | 10-193849 | A | 7/1998 | JP | 2002-319008 A | 10/2002 |
| JP | 10-293828 | A | 11/1998 | JP | 2002-319009 A | 10/2002 |
| JP | 11-039441 | A | 2/1999 | JP | 2002-319812 A | 10/2002 |
| JP | 11-075329 | A | 3/1999 | JP | 2002-362613 A | 12/2002 |
| JP | 11-085937 | A | 3/1999 | JP | 2002-373029 A | 12/2002 |
| JP | 11-102424 | A | 4/1999 | JP | 2002-373323 A | 12/2002 |
| JP | 11-103209 | A | 4/1999 | JP | 2002-374139 A | 12/2002 |
| JP | 11-149536 | A | 6/1999 | JP | 2003-006599 A | 1/2003 |
| JP | 11-149538 | A | 6/1999 | JP | 2003-016412 A | 1/2003 |
| JP | 11-219420 | A | 8/1999 | JP | 2003-026177 A | 1/2003 |
| JP | 11-220319 | A | 8/1999 | JP | 2003-030612 A | 1/2003 |
| JP | 11-328352 | A | 11/1999 | JP | 2003-44789 A | 2/2003 |
| JP | 11-346114 | A | 12/1999 | JP | 2003-046318 A | 2/2003 |
| JP | 11-515094 | A | 12/1999 | JP | 2003-58840 A | 2/2003 |
| JP | 2000-21128 | A | 1/2000 | JP | 2003-067711 A | 3/2003 |
| JP | 2000-021639 | A | 1/2000 | JP | 2003-069335 A | 3/2003 |
| JP | 2000-022421 | A | 1/2000 | JP | 2003-076947 A | 3/2003 |
| JP | 2005-229474 | A | 1/2000 | JP | 2003-78333 A | 3/2003 |
| JP | 2000-059260 | A | 2/2000 | JP | 2003-078336 A | 3/2003 |
| JP | 2000-085283 | A | 3/2000 | JP | 2003-085501 A | 3/2003 |
| JP | 2000-090207 | A | 3/2000 | JP | 2003-085520 A | 3/2003 |
| JP | 2000-132643 | A | 5/2000 | JP | 2003-87008 A | 3/2003 |
| JP | 2000-137778 | A | 5/2000 | JP | 2003-87044 A | 3/2003 |
| JP | 2000-137779 | A | 5/2000 | JP | 2003-099720 A | 4/2003 |
| JP | 2000-137785 | A | 5/2000 | JP | 2003-099721 A | 4/2003 |
| JP | 2000-148948 | A | 5/2000 | JP | 2003-110344 A | 4/2003 |
| JP | 2000-172812 | A | 6/2000 | JP | 2003-132330 A | 5/2003 |
| JP | 2000-209013 | A | 7/2000 | JP | 2003-134007 A | 5/2003 |
| JP | 2000-222540 | A | 8/2000 | JP | 2003-155062 A | 5/2003 |
| JP | 2000-510271 | A | 8/2000 | JP | 2003-158414 A | 5/2003 |
| JP | 2000-243797 | A | 9/2000 | JP | 2003-168760 A | 6/2003 |
| JP | 2000-251049 | A | 9/2000 | JP | 2003-187207 A | 7/2003 |
| JP | 2000-276569 | A | 10/2000 | JP | 2003-187211 A | 7/2003 |
| JP | 2000-286634 | A | 10/2000 | JP | 2003-188338 A | 7/2003 |
| JP | 2000-286760 | A | 10/2000 | JP | 2003-188620 A | 7/2003 |
| JP | 2000-311226 | A | 11/2000 | JP | 2003-198230 A | 7/2003 |
| JP | 2000-321984 | A | 11/2000 | JP | 2003-209421 A | 7/2003 |
| JP | 3075400 | U | 11/2000 | JP | 2003-216919 A | 7/2003 |
| JP | 2000-349680 | A | 12/2000 | JP | 2003-218624 A | 7/2003 |
| JP | 2001-028036 | A | 1/2001 | JP | 2003-233780 A | 8/2003 |
| JP | 2007-18067 | A | 1/2001 | JP | 2003-242471 A | 8/2003 |
| JP | 2001-043340 | A | 2/2001 | JP | 2003-243918 A | 8/2003 |
| JP | 2001-66990 | A | 3/2001 | JP | 2003-249813 A | 9/2003 |
| JP | 2001-505682 | A | 4/2001 | JP | 2003-529163 A | 9/2003 |
| JP | 2001-168628 | A | 6/2001 | JP | 2003-288560 A | 10/2003 |
| JP | 2001-188890 | A | 7/2001 | JP | 2003-309418 A | 10/2003 |
| JP | 2001-240046 | A | 9/2001 | JP | 2003-317060 A | 11/2003 |
| JP | 2001-256457 | A | 9/2001 | JP | 2003-331246 A | 11/2003 |
| JP | 2001-257292 | A | 9/2001 | JP | 2003-332820 A | 11/2003 |
| JP | 2001-514777 | A | 9/2001 | JP | 2004-040597 A | 2/2004 |
| JP | 2001-319380 | A | 11/2001 | JP | 2004-505481 A | 2/2004 |
| JP | 2001-331976 | A | 11/2001 | JP | 2004-082775 A | 3/2004 |
| JP | 2001-332923 | A | 11/2001 | JP | 2004-88218 A | 3/2004 |
| JP | 2001-339226 | A | 12/2001 | JP | 2004-096566 A | 3/2004 |
| JP | 2001-344574 | A | 12/2001 | JP | 2004-127230 A | 4/2004 |
| JP | 2001-351084 | A | 12/2001 | JP | 2004-519916 A | 7/2004 |
| JP | 2001-352176 | A | 12/2001 | JP | 2004-253858 A | 9/2004 |
| JP | 2002-024776 | A | 1/2002 | JP | 2004-527864 A | 9/2004 |
| JP | 2002-026513 | A | 1/2002 | JP | 2004-280390 A | 10/2004 |
| JP | 2002-042076 | A | 2/2002 | JP | 2004-287767 A | 10/2004 |
| JP | 2002-063557 | A | 2/2002 | JP | 2004-297249 A | 10/2004 |
| JP | 2002-505645 | A | 2/2002 | JP | 2004-297681 A | 10/2004 |
| JP | 2002-76750 | A | 3/2002 | JP | 2004-319848 A | 11/2004 |
| JP | 2002-076750 | A | 3/2002 | JP | 2004-326380 A | 11/2004 |
| JP | 2002-150245 | A | 5/2002 | JP | 2004-334268 A | 11/2004 |
| JP | 2002-157564 | A | 5/2002 | JP | 2004-336250 A | 11/2004 |
| JP | 2002-158529 | A | 5/2002 | JP | 2004-343000 A | 12/2004 |
| JP | 2002-175508 | A | 6/2002 | JP | 2004-362190 A | 12/2004 |
| JP | 2002-183690 | A | 6/2002 | JP | 2004-362341 A | 12/2004 |
| JP | 2002-185358 | A | 6/2002 | JP | 2004-362602 A | 12/2004 |
| JP | 2002-204117 | A | 7/2002 | JP | 2005-5866 A | 1/2005 |
| JP | 2002-522849 | A | 7/2002 | JP | 2005-18156 A | 1/2005 |
| JP | 2002-230128 | A | 8/2002 | JP | 2005-124061 A | 5/2005 |
| JP | 2002-232221 | A | 8/2002 | JP | 2005-129019 A | 5/2005 |
| JP | 2002-252117 | A | 9/2002 | JP | 2005-136528 A | 5/2005 |
| JP | 2002-259934 | A | 9/2002 | JP | 2005-137032 A | 5/2005 |

| | | |
|---|---|---|
| JP | 3653099 B2 | 5/2005 |
| JP | 2005-165839 A | 6/2005 |
| JP | 2005-167327 A | 6/2005 |
| JP | 2005-167813 A | 6/2005 |
| JP | 2005-190417 A | 7/2005 |
| JP | 2005-191705 A | 7/2005 |
| JP | 2005-210676 A | 8/2005 |
| JP | 2005-210680 A | 8/2005 |
| JP | 2005-217822 A | 8/2005 |
| JP | 2005-236339 A | 9/2005 |
| JP | 2005-244778 A | 9/2005 |
| JP | 2005-275870 A | 10/2005 |
| JP | 2005-284352 A | 10/2005 |
| JP | 2005-293537 A | 10/2005 |
| JP | 2005-295135 A | 10/2005 |
| JP | 2005-311205 A | 11/2005 |
| JP | 2005-321305 A | 11/2005 |
| JP | 2005-335755 A | 12/2005 |
| JP | 2005-346820 A | 12/2005 |
| JP | 2005-352858 A | 12/2005 |
| JP | 2006-025390 A | 1/2006 |
| JP | 2006-031766 A | 2/2006 |
| JP | 2006-39902 A | 2/2006 |
| JP | 2006-42059 A | 2/2006 |
| JP | 2006-67479 A | 3/2006 |
| JP | 2006-72706 A | 3/2006 |
| JP | 2006-80367 A | 3/2006 |
| JP | 2006-92630 A | 4/2006 |
| JP | 2006-102953 A | 4/2006 |
| JP | 2006-107296 A | 4/2006 |
| JP | 2006-513594 A | 4/2006 |
| JP | 2006-148518 A | 6/2006 |
| JP | 2006-151402 A | 6/2006 |
| JP | 2006-174151 A | 6/2006 |
| JP | 2006-195795 A | 7/2006 |
| JP | 2006-203187 A | 8/2006 |
| JP | 2006-203852 A | 8/2006 |
| JP | 2006-217000 A | 8/2006 |
| JP | 2006-232292 A | 9/2006 |
| JP | 2006-237674 A | 9/2006 |
| JP | 2006-270212 A | 10/2006 |
| JP | 2006-270766 A | 10/2006 |
| JP | 2006-285911 A | 10/2006 |
| JP | 2006-295879 A | 10/2006 |
| JP | 2006-302219 A | 11/2006 |
| JP | 2006-309401 A | 11/2006 |
| JP | 2006-311239 A | 11/2006 |
| JP | 2006-323481 A | 11/2006 |
| JP | 2007-007888 A | 1/2007 |
| JP | 2007-13120 A | 1/2007 |
| JP | 2007-043535 A | 2/2007 |
| JP | 2007-048126 A | 2/2007 |
| JP | 2007-65822 A | 3/2007 |
| JP | 2007-79687 A | 3/2007 |
| JP | 2007-81712 A | 3/2007 |
| JP | 2007-096768 A | 4/2007 |
| JP | 2007-122542 A | 5/2007 |
| JP | 2007-150868 A | 6/2007 |
| JP | 2007-159083 A | 6/2007 |
| JP | 2007-159129 A | 6/2007 |
| JP | 2007-228325 A | 9/2007 |
| JP | 2007-266999 A | 10/2007 |
| JP | 2007-312350 A | 11/2007 |
| JP | 4069958 B2 | 4/2008 |
| JP | 2008-160874 A | 7/2008 |
| JP | 11-175678 A | 1/2009 |
| JP | 2009-27291 A | 2/2009 |
| NL | 9100176 A | 3/1992 |
| NL | 9100347 A | 3/1992 |
| WO | 99/67754 A1 | 12/1999 |
| WO | 00/10122 A2 | 2/2000 |
| WO | 02/061675 A1 | 8/2002 |
| WO | 02/097723 A1 | 12/2002 |
| WO | 03/079305 A1 | 9/2003 |
| WO | 2004/036772 A1 | 4/2004 |
| WO | 2004/070879 A | 8/2004 |
| WO | 2004/072892 A1 | 8/2004 |
| WO | 2005/073937 A | 8/2005 |
| WO | 2005/115849 A1 | 12/2005 |
| WO | 2006/045682 A | 5/2006 |
| WO | 2007/083574 A1 | 7/2007 |
| WO | 2007/083575 A1 | 7/2007 |
| WO | 2007/119310 A1 | 10/2007 |
| WO | 2007/125683 A1 | 11/2007 |
| WO | 2007/138857 A1 | 12/2007 |
| WO | 2008/007606 A | 1/2008 |
| WO | 2008/140037 A1 | 11/2008 |
| WO | 2009/011376 A1 | 1/2009 |

OTHER PUBLICATIONS

Kato et al.: "Wireless IC Device," U.S. Appl. No. 12/603,608, filed Oct. 22, 2009.
Kato et al.: "Wireless IC Device,"; U.S. Appl. No. 12/688,072, filed Jan. 15, 2010.
Official Communication issued in International Patent Application No. PCT/JP2009/053693, mailed on Jun. 9, 2009.
Kato: "Composite Antenna,"; U.S. Appl. No. 12/845,846, filed Jul. 29, 2010.
Official Communication issued in International Patent Application No. PCT/JP2009/053690, mailed on Jun. 2, 2009.
Kato et al.: "Radio Frequency IC Device and Radio Communication System,"; U.S. Appl. No. 12/859,340, filed Aug. 19, 2010.
Official Communication issued in International Patent Application No. PCT/JP2009/055758, mailed on Jun. 23, 2009.
Kato et al.: "Wireless IC Device,"; U.S. Appl. No. 12/859,880, filed Aug. 20, 2010.
Official Communication issued in International Patent Application No. PCT/JP2009/057482, mailed on Jul. 21, 2009.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Official communication issued in International Application No. PCT/JP2008/050356, mailed on Mar. 25, 2008.
Osamura et al.: "Packaging Material With Electromagnetic Coupling Module,"; U.S. Appl. No. 12/536,669, filed Aug. 6, 2009.
Dokai et al.: "Wireless IC Device and Component for Wireless IC Device,"; U.S. Appl. No. 12/543,553, filed Aug. 19, 2009.
Shioya et al.: "Wireless IC Device,"; U.S. Appl. No. 12/551,037, filed Aug. 31, 2009.
Ikemoto: "Wireless IC Device and Manufacturing Method Thereof,"; U.S. Appl. No. 12/579,672, filed Oct. 15, 2009.
Official communication issued in International Application No. PCT/JP2008/058614, mailed on Jun. 10, 2008.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.

Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Device"; U.S. Appl. No. 12/429,346, filed Apr. 24, 2009.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags")", RFID, pp. 112-126.
Dokai et al.: "Wireless IC Device and Component for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; mailed on Aug. 25, 2008.
Official communication issued in counterpart International Application No. PCT/JP2008/071502, mailed Feb. 24, 2009.
Kato et al.: "Wireless IC Device and Manufacturing Method Thereof," U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device," U.S. Appl. No. 12/469,896, filed May 21, 2009.
Ikemoto et al.: "Wireless IC Device," U.S. Appl. No. 12/496,709, filed Jul. 2, 2009.
Official communication issued in counterpart International Application No. PCT/JP2008/062947, mailed Aug. 19, 2008.
Official communication issued in counterpart International Application No. PCT/JP2008/056026, mailed Jul. 1, 2008.
Ikemoto et al.: "Wireless IC Device and Electronic Apparatus,"; U.S. Appl. No. 12/503,188, filed Jul. 15, 2009.
Official communication issued in counterpart International Application No. PCT/JP2008/055567, mailed May 20, 2008.
Official communication issued in counterpart International Application No. PCT/JP2008/051853, mailed Apr. 22, 2008.
Official communication issued in counterpart International Application No. PCT/JP2008/057239, mailed Jul. 22, 2008.
Kimura et al.: "Wireless IC Device,"; U.S. Appl. No. 12/510,338, filed Jul. 28, 2009.
Kato et al.: "Wireless IC Device,"; U.S. Appl. No. 12/510,340, filed Jul. 28, 2009.
Kato: "Wireless IC Device,"; U.S. Appl. No. 12/510,344, filed Jul. 28, 2009.
Kato et al.: "Wireless IC Device,"; U.S. Appl. No. 12/510,347, filed Jul. 28, 2009.
English translation of NL9100176, published on Mar. 2, 1992.
English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed on Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.

* cited by examiner

WIRELESS IC DEVICE, ELECTRONIC APPARATUS, AND METHOD FOR ADJUSTING RESONANT FREQUENCY OF WIRELESS IC DEVICE

BACKGROUND OF THE INVENTION

1. Field of the Invention

The present invention relates to a wireless IC device, and, more particularly, to a wireless IC device having a wireless IC chip used in an RFID (Radio Frequency Identification) system, an electronic apparatus including the wireless IC device, and a method for adjusting a resonant frequency of a wireless IC device.

2. Description of the Related Art

In recent years, an RFID system has been developed as an article management system, which includes: a reader/writer that generates an induction field; and an IC chip (also referred to as IC tag or wireless IC chip) that has stored predetermined information therein and is attached to an article, a container, or the like, and noncontact communication is established between the reader/writer and the IC chip to transmit the information therebetween.

Japanese Unexamined Patent Application Publication (Translation of PCT Application) No. 11-515094 discloses an RFID tag including an IC chip and an antenna formed within a printed wiring circuit board. In the RFID tag, the antenna within the printed wiring circuit board and the IC chip mounted on the principal surface of the board are connected to each other in an electrically conductive state. Miniaturization of the RFID tag is achieved by disposing the antenna within the printed wiring circuit board.

However, because the RFID tag includes a dedicated antenna, a process of fabricating an antenna is required, leading to an increase in cost. Further, a mounting space for the antenna is also required, resulting in an increase in size. If the IC chip is changed, it is necessary to change the shape of the antenna or the like as well.

SUMMARY OF THE INVENTION

An objective of the present invention is to provide: a wireless IC device that can achieve miniaturization and improve the gain of a radiator plate (electrode) that functions as an antenna, without providing a dedicated antenna; an electronic apparatus including the wireless IC device; and a method for adjusting a resonant frequency of a wireless IC device.

To achieve the above objective, a first aspect of the present invention provides a wireless IC device that includes:

a wireless IC chip that processes a transmission/reception signal;

a circuit board on which the wireless IC chip is mounted;

an electrode formed on the circuit board; and a loop electrode formed on the circuit board so as to be coupled to the wireless IC chip and the electrode.

The electrode is formed with a slit and/or a cutout for adjusting a resonant frequency thereof.

A second aspect of the present invention provides a wireless IC device that includes:

an electromagnetic coupling module including a wireless IC that processes a transmission/reception signal and a power supply circuit board that includes an inductance element coupled to the wireless IC;

a circuit board on which the electromagnetic coupling module is mounted;

an electrode formed on the circuit board; and a loop electrode formed on the circuit board so as to be coupled to the power supply circuit board and the electrode.

The electrode is formed with a slit and/or a cutout for adjusting a resonant frequency thereof.

In the wireless IC device, the wireless IC chip or the power supply circuit board is coupled to the electrode, formed on the circuit board, such as a ground electrode, via the loop electrode, and the electrode formed on the circuit board functions as a radiator plate (antenna) of the wireless IC (chip). In other words, the wireless IC (chip) is activated via the loop electrode by a signal received by the electrode, and a response signal from the wireless IC (chip) is radiated from the electrode to the outside via the loop electrode. Therefore, it is unnecessary to fabricate a dedicated antenna, and it is unnecessary to provide a space for mounting the antenna. Further, the loop electrode can provide impedance matching between the wireless IC (chip) and the electrode, and hence it is unnecessary to provide a separate matching part, thereby improving the efficiency of signal transmission between the wireless IC (chip) and the electrode.

Incidentally, the gain of the radiator plate (antenna) becomes great when the radiator plate resonates, and the resonant frequency becomes a specific value with both ends of the radiator plate (electrode) as resonance ends. When the ground electrode is used as an antenna, the size of the electrode is determined mainly by the size of the circuit board. In this case, the resonant frequency of the electrode may be different from the frequency used in the RFID system, and there is the possibility that the gain, when used as the antenna, decreases. In the wireless IC device, a resonant mode can be optionally set by forming, in an electrode that functions as an antenna, a slit and/or a cutout for adjusting the resonant frequency of the electrode, and the electrode has a preferable resonant frequency close to the frequency used in the RFID system. Thus, the gain is improved.

In the wireless IC device according to the second aspect, the power supply circuit board is interposed between the wireless IC, such as a wireless IC chip, and the loop electrode. The power supply circuit board includes a resonant circuit and/or a matching circuit including an inductance element, and the frequency used is substantially set by the resonant circuit and/or the matching circuit. When the wireless IC is changed in accordance with the frequency used in the RFID system, it is only necessary to change the design of the resonant circuit and/or the matching circuit, and there is no need to change the shape, size, or location of the radiator plate (electrode) or the coupling state between the loop electrode and the electrode or the power supply circuit board. Further, the resonant circuit and/or the matching circuit can also have a function of matching the impedance between the wireless IC and the electrode, thereby making it possible to improve the efficiency of signal transmission between the wireless IC and the electrode.

It is noted that in addition to having stored various kinds of information related to an article to which the wireless IC device is to be attached, the wireless IC (chip) may allow rewriting of information, or may have an information processing function other than the RFID system.

A third aspect of the present invention provides an electronic apparatus that includes the wireless IC device according to the first aspect or the second aspect.

A fourth aspect of the present invention provides a method for adjusting a resonant frequency of a wireless IC device that includes: a wireless IC chip that processes a transmission/reception signal; a circuit board on which the wireless IC chip is mounted; an electrode formed on the circuit board; and a loop electrode formed on the circuit board so as to be coupled to the wireless IC chip and the electrode. The method includes the step of adjusting the resonant frequency by forming a slit and/or a cutout in the electrode.

A fifth aspect of the present invention provides a method for adjusting a resonant frequency of a wireless IC device that includes: an electromagnetic coupling module including a wireless IC that processes a transmission/reception signal, and a power supply circuit board that includes an inductance element coupled to the wireless IC; a circuit board on which the electromagnetic coupling module is mounted; an electrode formed on the circuit board; and a loop electrode formed on the circuit board so as to be coupled to the power supply circuit board and the electrode. The method includes the step of adjusting the resonant frequency by forming a slit and/or a cutout in the electrode.

According to the present invention, an existing electrode on the circuit board can be used as an antenna, and thus it is unnecessary to dispose an antenna as a separate component, thereby achieving miniaturization of the wireless IC device or the apparatus provided with the wireless IC device. Further, by forming a slit and/or a cutout, the resonant frequency of the electrode that functions as an antenna can be adjusted, thereby improving gain.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 shows a wireless IC device according to a first basic preferred embodiment, in which

FIG. 3 shows a wireless IC device according to a second basic preferred embodiment, in which

FIG. 4 shows a wireless IC device according to a third basic preferred embodiment, in which

FIG. 5 shows a wireless IC device according to a fourth basic preferred embodiment, in which

DETAILED DESCRIPTION OF THE PREFERRED EMBODIMENTS

Figure 1A:
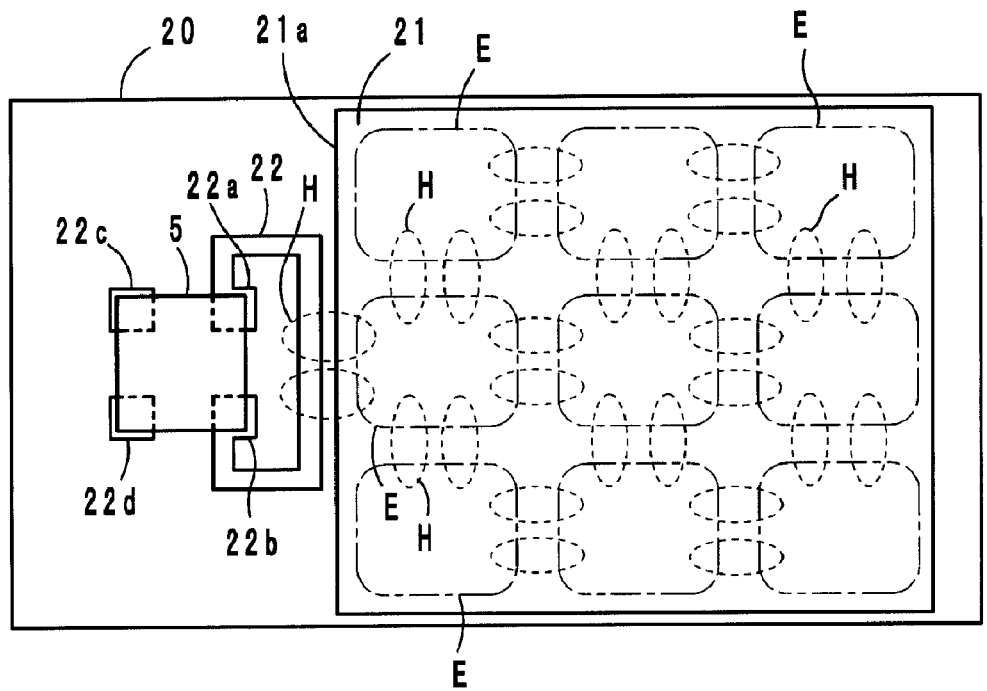
FIG. 1(A) is a plan view and FIG. 1(B) is a cross-sectional view.

Hereinafter, preferred embodiments of a wireless IC device, an electronic apparatus, and a method for adjusting a resonant frequency of a wireless IC device, according to the present invention, will be described with reference to the accompanying drawings. It is noted that in the drawings, common elements and portions are denoted by the same reference numerals, and the overlap description is omitted.

First Basic Preferred Embodiment

Figure 1B:
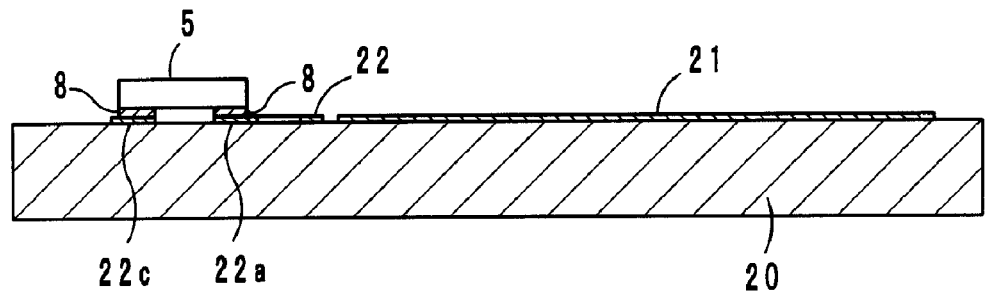
Figure 2:
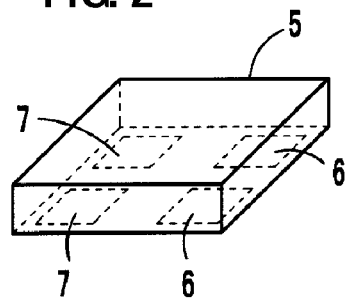
FIG. 2 is a perspective view of a wireless IC chip.

See FIGS. 1 and 2

FIG. 1 shows a wireless IC device according to a first basic preferred embodiment of the present invention. In the first basic preferred embodiment, a loop electrode 22 and a ground electrode 21 are separately provided on a printed wiring circuit board 20, and a wireless IC chip 5 that processes a transmission/reception signal of a predetermined frequency is coupled to the loop electrode 22. The ground electrode 21 and the loop electrode 22 are provided on the principal surface of the printed wiring circuit board 20 through application of a conductive paste, etching of a metal foil provided on the circuit board 20, or the like.

The wireless IC chip 5 includes a clock circuit, a logic circuit, a memory circuit, and the like, and has stored necessary information therein. As shown in FIG. 2, input/output terminal electrodes 6 and mounting terminal electrodes 7 are provided on the back surface of the wireless IC chip 5. The input/output terminal electrodes 6 are electrically connected via metal bumps 8 to connecting electrodes 22a and 22b provided at opposite ends of the loop electrode 22. A pair of connecting electrodes 22c and 22d is provided on the circuit board 20. The terminal electrodes 7 of the wireless IC chip 5 are electrically connected to the connecting electrodes 22c and 22d via metal bumps 8.

The loop electrode 22 is provided parallel to and in proximity to an edge portion 21a of the ground electrode 21. The two electrodes are coupled together by an electric field. In other words, by placing the loop electrode 22 in proximity to the edge portion 21a of the ground electrode 21, a loop magnetic field H (see dotted lines in FIG. 1(A)) is generated in an orthogonal direction from the loop electrode 22, and the magnetic field H is orthogonal to the ground electrode 21, whereby a loop electric field E (see an alternate long and short dash line in FIG. 1(A)) is excited at the edge portion 21a of the ground electrode 21. Further, another loop magnetic field H is induced by this loop electric field E. In this manner, the loop electric fields E and the loop magnetic fields H spread out over the entire surface of the ground electrode 21, radiating high-frequency signals into the air. By arranging the ground electrode 21 and the loop electrode 22 in proximity to each other and in an insulated state as described above, the two electrodes can be electromagnetically coupled to each other in an assured manner, thereby improving a radiation characteristic.

Because the loop electrode 22 is electromagnetically coupled to the ground electrode 21 as described above, a high-frequency signal radiated from the reader/writer and received by the ground electrode 21 is supplied to the wireless IC chip 5 via the loop electrode 22, thereby activating the wireless IC chip 5. On the other hand, a response signal from the wireless IC chip 5 is transmitted to the ground electrode 21 via the loop electrode 22, and radiated to the reader/writer from the ground electrode 21.

The ground electrode 21 may be an existing electrode provided on the printed wiring circuit board 20 of an electronic apparatus in which this wireless IC device is accommodated. Alternatively, the ground electrode 21 may be one used as the ground electrode of another electronic component mounted in the electronic apparatus. Therefore, this wireless IC device does not require fabrication of a dedicated antenna, and does not require a space for its mounting. Moreover, the ground electrode 21 is formed in a large size, thereby improving radiation gain.

Further, proper impedance matching can be achieved between the wireless IC chip 5 and the ground electrode 21 by adjusting the length and the width of the loop electrode 22, the distance from the ground electrode 21 to the loop electrode 22, and the like. In addition, the circuit board 20 may be a multilayer board in which multiple dielectric layers or magnetic layers are laminated. When the circuit board 20 is such a multilayer board, the loop electrode 22 and the ground electrode 21 may be disposed in multiple layers of the multilayer circuit board 20, so as to be in an electrically conductive state using known via-hole conductors. Moreover, the loop electrode 22 and the ground electrode 21 may be disposed on the back surface of the circuit board 20, and the wireless IC chip 5 disposed on the circuit board 20 may be coupled to the loop electrode 22 via a via-hole conductor.

Second Basic Preferred Embodiment

Figure 3A:
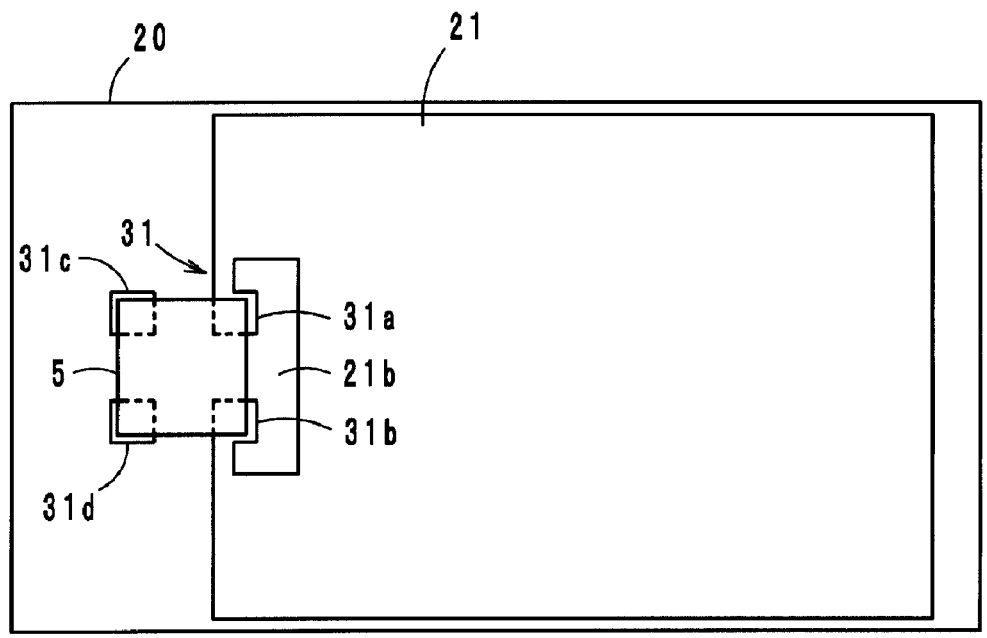
FIG. 3(A) is a plan view and FIG. 3(B) is a cross-sectional view.
Figure 3B:
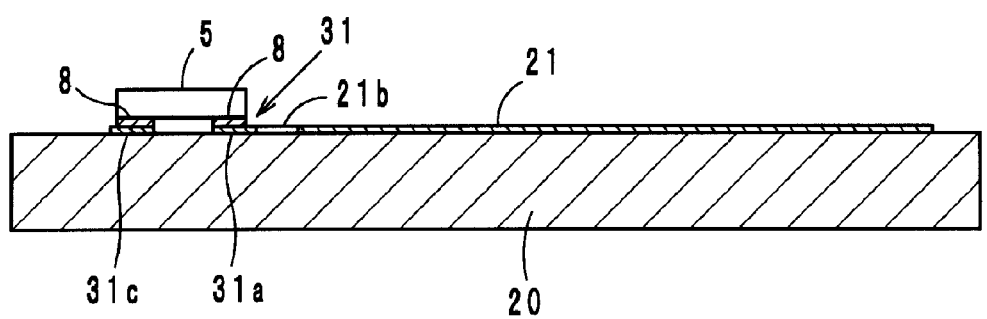

See FIG. 3

FIG. 3 shows a wireless IC device according to a second basic preferred embodiment of the present invention. In the second basic preferred embodiment, by forming an opening 21b at one side of the ground electrode 21 provided on the printed wiring circuit board 20, the loop electrode 31 is provided around the opening 21b, and connecting electrodes 31a and 31b are electrically connected to the input/output terminal electrodes 6 (see FIG. 2) of the wireless IC chip 5 via the metal bumps 8. Further, connecting electrodes 31c and 31d are formed on the front surface of the circuit board 20 and electrically connected to the mounting terminal electrodes 7 of the wireless IC chip 5 via the metal bumps 8.

In the second basic preferred embodiment, the loop electrode 31 is coupled to the ground electrode 21 in an electrically conductive state, and the wireless IC chip 5 and the ground electrode 21 are coupled to each other due to the intermediation of the loop electrode 31. The operation of the second basic preferred embodiment is basically the same as that of the above-mentioned first basic preferred embodiment. Also, the effects and advantages of the second basic preferred embodiment are as described in the above-mentioned first basic preferred embodiment.

It is noted that the loop electrode 31 can have various structures as described in detail below. Further, it should be understood that the ground electrode 21 and the loop electrode 31 may be disposed within the circuit board 20 or on the back surface of the circuit board 20.

Third Basic Preferred Embodiment

Figure 4A:
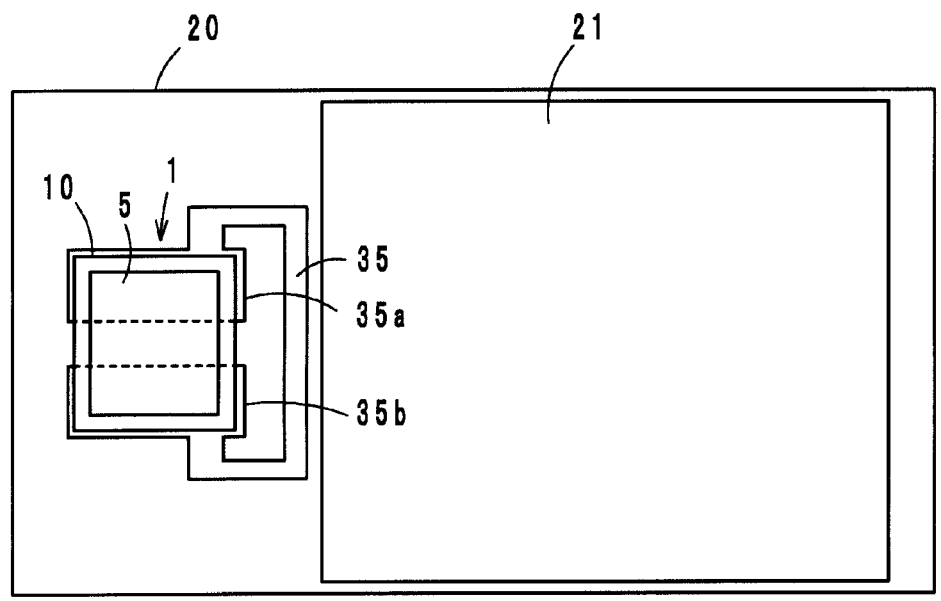
FIG. 4(A) is a plan view and FIG. 4(B) is a cross-sectional view.
Figure 4B:
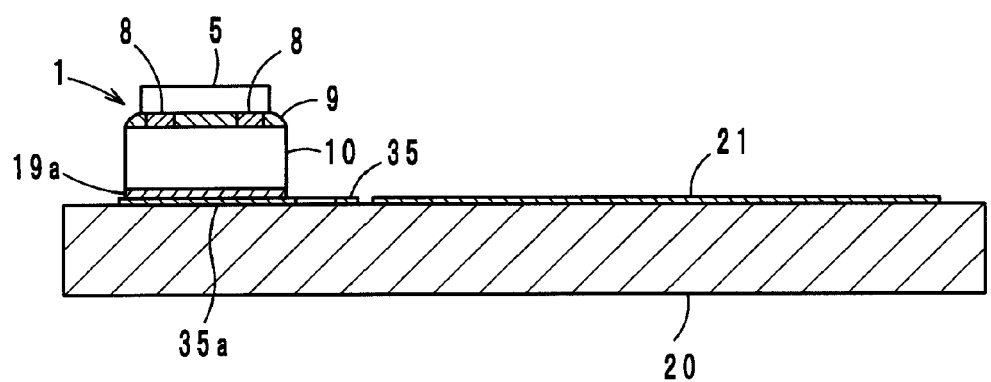

See FIG. 4

FIG. 4 shows a wireless IC device according to a third basic preferred embodiment of the present invention. In the third basic preferred embodiment, the wireless IC chip 5 is mounted on a power supply circuit board 10 to form an electromagnetic coupling module 1, and the electromagnetic coupling module 1 is electrically connected to a loop electrode 35 provided on the printed wiring circuit board 20. Like the loop electrode 22 (see FIG. 1) described in the above-mentioned first basic preferred embodiment, the loop electrode 35 is disposed in proximity to the ground electrode 21 provided on the front surface of the circuit board 20, and is magnetically coupled to the ground electrode 21.

In the wireless IC chip 5, the input/output terminal electrodes 6 shown in FIG. 2 are electrically connected via the metal bumps 8 to electrodes 12a and 12b (see FIGS. 6 and 7) provided on the front surface of the power supply circuit board 10, and the mounting terminal electrodes 7 are electrically connected to electrodes 12c and 12d. Further, a protective film is provided between the front surface of the power supply circuit board 10 and the back surface of the wireless IC chip 5. The protective film 9 also provides an effect of enhancing the bonding strength between the power supply circuit board 10 and the wireless IC chip 5.

The power supply circuit board 10 incorporates a resonant circuit (not shown in FIG. 4) having an inductance element. External electrodes 19a and 19b (see FIGS. 6 and 7) are provided on the back surface of the power supply circuit board 10. The connecting electrodes 12a to 12d (see FIGS. 6 and 7) are provided on the front surface of the power supply circuit board 10. The external electrodes 19a and 19b are electromagnetically coupled to the resonant circuit incorporated in the board 10, and are connected to connecting electrodes 35a and 35b of the loop electrode 35 in an electrically conductive state via a conductive adhesive (not shown). Alternatively, solder or the like may be used for this electrical connection.

In other words, a resonant circuit having a predetermined resonant frequency is incorporated in the power supply circuit board 10, and a transmission signal originated from the wireless IC chip 5 and having a predetermined frequency is transmitted to the ground electrode 21 via the external electrodes 19a and 19b and the loop electrode 35, and a reception signal having a predetermined frequency is selected from signals received by the ground electrode 21 and is supplied to the wireless IC chip 5. Thus, in this wireless IC device, the wireless IC chip 5 is activated by a signal received by the ground electrode 21, and a response signal from the wireless IC chip 5 is radiated to the outside from the ground electrode 21.

In the electromagnetic coupling module 1, the external electrodes 19a and 19b provided on the back surface of the power supply circuit board 10 are electromagnetically coupled to the resonant circuit incorporated in the board 10, and are also electrically conducted to the loop electrode 35 that is electrically coupled to the ground electrode 21 that functions as an antenna. Because the electromagnetic coupling module 1 does not need to be provided with an antenna element that is relatively large in size as a separate part, the electromagnetic coupling module 1 can be reduced in size. Because the power supply circuit board 10 is also reduced in size, the wireless IC chip 5 may simply be mounted on the power supply circuit board 10 thus reduced in size, which allows use of an IC mounter or the like widely used in the related art, leading to a reduction in mounting cost. Further, a frequency band used can be changed by simply changing the design of the resonant circuit.

Only an inductance element may be formed as an element formed within the power supply circuit board 10. The inductance element has a function of matching the impedance between the wireless IC chip 5 and the radiator plate (ground electrode 21).

Fourth Basic Preferred Embodiment

Figure 5A:
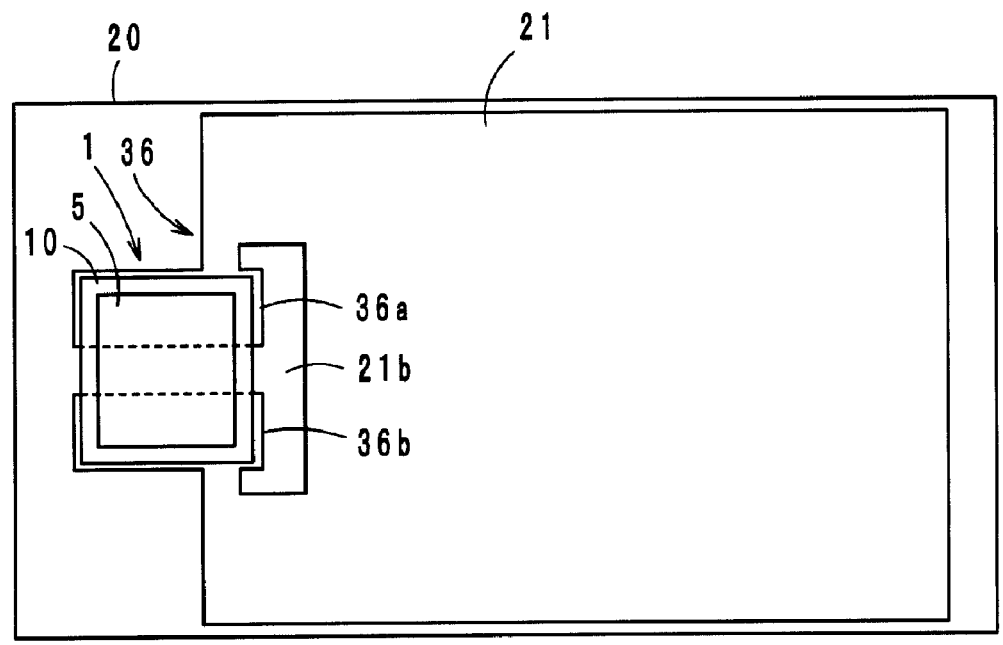
FIG. 5(A) is a plan view and FIG. 5(B) is a cross-sectional view.
Figure 5B:
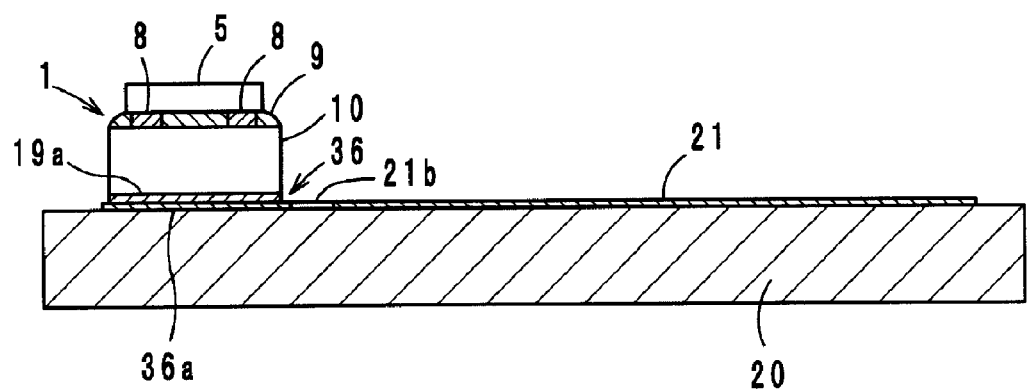

See FIG. 5

FIG. 5 shows a wireless IC device according to a fourth basic preferred embodiment of the present invention. In the fourth basic preferred embodiment, by forming the opening 21b at one side of the ground electrode 21 provided on the printed wiring circuit board 20, a loop electrode 36 is provided around the opening 21b, and the electromagnetic coupling module having the wireless IC chip 5 mounted on the power supply circuit board 10 is electrically connected to the loop electrode 36. The loop electrode 36 has connecting electrodes 36a and 36b that are connected to the external electrodes 19a and 19b, which are provided on the back surface of the power supply circuit board 10, in an electrically conductive state via a conductive adhesive (not shown). It is noted that the configuration and the operation of the power supply circuit board 10 in the fourth basic preferred embodiment are the same as those in the above-mentioned third basic preferred embodiment, and the effects and advantages of the loop electrode 36 are the same as those of the loop electrode 31 described in the above-mentioned second basic preferred embodiment.

First Example of Resonant Circuit

Figure 6:
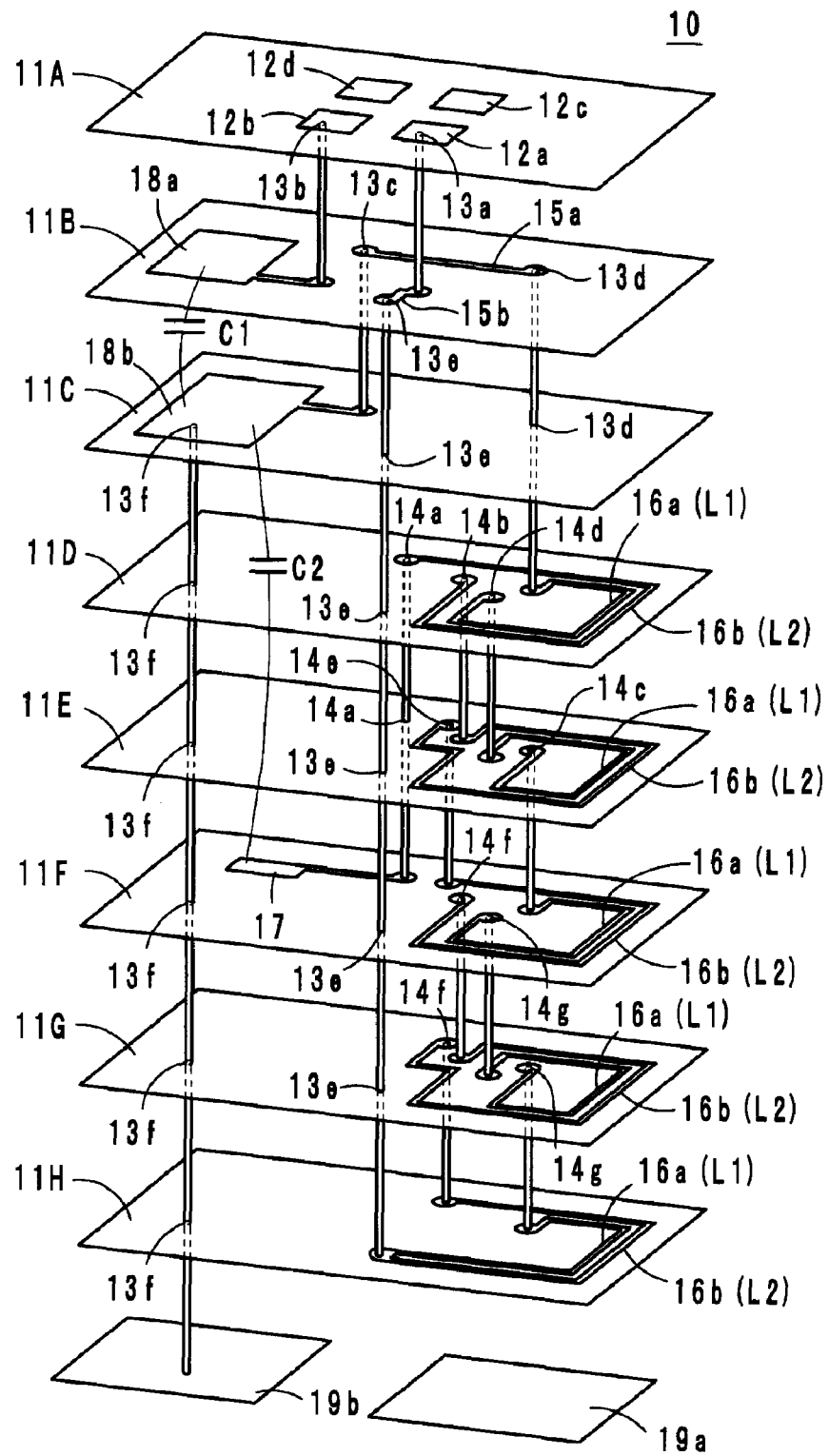
FIG. 6 is an exploded perspective view of a power supply circuit board that incorporates a first example of a resonant circuit.

See FIG. 6

A first example of a resonant circuit incorporated in the power supply circuit board 10 is shown in FIG. 6. The power supply circuit board 10 is formed by laminating, pressure-bonding, and firing ceramic sheets 11A to 11H each made of a dielectric material. The connecting electrodes 12a and 12b, the electrodes 12c and 12d, and via-hole conductors 13a, 13b are formed in the sheet 11A; a capacitor electrode 18a, conductor patterns 15a and 15b, and via-hole conductors 13c to 13e are formed in the sheet 11B; and a capacitor electrode 18b and via-hole conductors 13d to 13f are formed in the sheet 11C. Further, conductor patterns 16a and 16b and via-hole conductors 13e, 13f, 14a, 14b, and 14d are formed in the sheet 11D; conductor patterns 16a and 16b and via-hole conductors 13e, 13f, 14a, 14c, and 14e are formed in the sheet 11E; a capacitor electrode 17, conductor patterns 16a and 16b, and via-hole conductors 13e, 13f, 14f, and 14g are formed in the sheet 11F; conductor patterns 16a and 16b and via-hole conductors 13e, 13f, 14f, and 14g are formed in the sheet 11G; and conductor patterns 16a and 16b and a via-hole conductor 13f are formed in the sheet 11H.

By laminating the above sheets 11A to 11H, an inductance element L1 is formed of the conductor patterns 16a connected spirally via the via-hole conductors 14c, 14d, and 14g; an inductance element L2 is formed of the conductor patterns 16b connected spirally via the via-hole conductors 14b, 14e, and 14f; a capacitance element C1 is formed of the capacitor electrodes 18a and 18b; and a capacitance element C2 is formed of the capacitor electrodes 18a and 17.

One end of the inductance element L1 is connected to the capacitor electrode 18b via the via-hole 13d, the conductor pattern 15a, and the via-hole conductor 13c. One end of the inductance element L2 is connected to the capacitor electrode 17 via the via-hole conductor 14a. In addition, the other ends of the inductance elements L1 and L2 are combined together on the sheet 11H, and connected to the connecting electrode 12a via the via-hole conductor 13e, the conductor pattern 15b, and the via-hole conductor 13a. Further, the capacitor electrode 18a is electrically connected to the connecting electrode 12b via the via-hole conductor 13b.

The connecting electrodes 12a and 12b are electrically connected to the terminal electrodes 6 of the wireless IC chip 5 via the metal bumps 8. The electrodes 12c, 12d are connected to the terminal electrodes 7 of the wireless IC chip 5.

Further, the external electrodes 19a and 19b are provided on the back surface of the power supply circuit board by application of a conductive paste or the like. The external electrode 19a is magnetically coupled to the inductance elements L (L1 and L2), and the external electrode 19b is electrically connected to the capacitor electrode 18b via the via-hole conductor 13f. As described above, the external electrodes 19a and 19b are electrically connected to the connecting electrodes 35a and 35b or 36a and 36b of the loop electrode 35 or 36.

It is noted that in the resonant circuit, the inductance elements L1 and L2 are structured such that the two conductor patterns 16a and 16b are arranged in parallel with each other. The two conductor patterns 16a and 16b have different line lengths, so different resonant frequencies can be set for the two conductor patterns 16a and 16b. Thus, the wireless IC device can have a wide band.

It is noted that the ceramic sheets 11A to 11H may be made of a magnetic ceramic material, and the power supply circuit board 10 can be easily obtained by a process of fabricating a multilayer board, such as sheet lamination or thick film printing used in the related art.

Further, the sheets 11A to 11H may be formed as flexible sheets made of a dielectric material such as polyimide or liquid crystal polymer, electrodes and conductors may be formed on the sheets by thick film formation or the like, these sheets may be laminated and thermally bonded to form a laminated body, and the inductance elements L1 and L2 and the capacitance elements C1 and C2 may be incorporated in the laminated body.

In the power supply circuit board 10, the inductance elements L1 and L2 and the capacitance elements C1 and C2 are provided at different positions in plan view. The power supply circuit board 10 is magnetically coupled to the external electrode 19a by the inductance elements L1 and L2, and the external electrode 19b is one electrode constituting the capacitance element C1.

Therefore, in the electromagnetic coupling module 1 having the wireless IC chip 5 mounted on the power supply circuit board 10, a high-frequency signal (in a UHF frequency band, for example) radiated from the reader/writer (not shown) is received by the ground electrode 21, the resonant circuit that is magnetically and electrically coupled to the external electrodes 19a and 19b via the loop electrode 35 or 36 is resonated, and only a reception signal in a predetermined frequency band is supplied to the wireless IC chip 5. On the other hand, predetermined energy is extracted from this reception signal, and information stored in the wireless IC chip is matched with a predetermined frequency in the resonant circuit using this energy as a driving source. After that, the information is transmitted to the ground electrode 21 via the external electrodes 19a and 19b and the loop electrode 35 or 36, and then transmitted and transferred from the ground electrode 21 to the reader/writer.

In the power supply circuit board 10, a resonant frequency characteristic is determined by the resonant circuit formed of the inductance elements L1 and L2 and the capacitance elements C1 and C2. The resonant frequency of a signal radiated from the ground electrode 21 is substantially determined by the self resonant frequency of the resonant circuit.

Incidentally, the resonant circuit also serves as a matching circuit for matching the impedance of the wireless IC chip 5 with the impedance of the ground electrode 21. The power supply circuit board 10 may include a matching circuit provided separately from the resonant circuit formed of the inductance elements and the capacitance elements (in this sense, the resonant circuit is also referred to as matching circuit). If the function of a matching circuit is added to the resonant circuit, the design of the resonant circuit tends to be complex. When a matching circuit is provided separately from the resonant circuit, the resonant circuit and the matching circuit can be designed separately. It is noted that the loop electrodes 35 and 36 may have an impedance matching function or a function as a resonant circuit. In this case, the radiation characteristic can be improved by designing the resonant circuit (matching circuit) within the power supply circuit board 10 while taking into consideration the shape of the loop electrode, the size of the ground electrode serving as a radiator plate, and the like.

Second Example of Resonant Circuit

Figure 7:
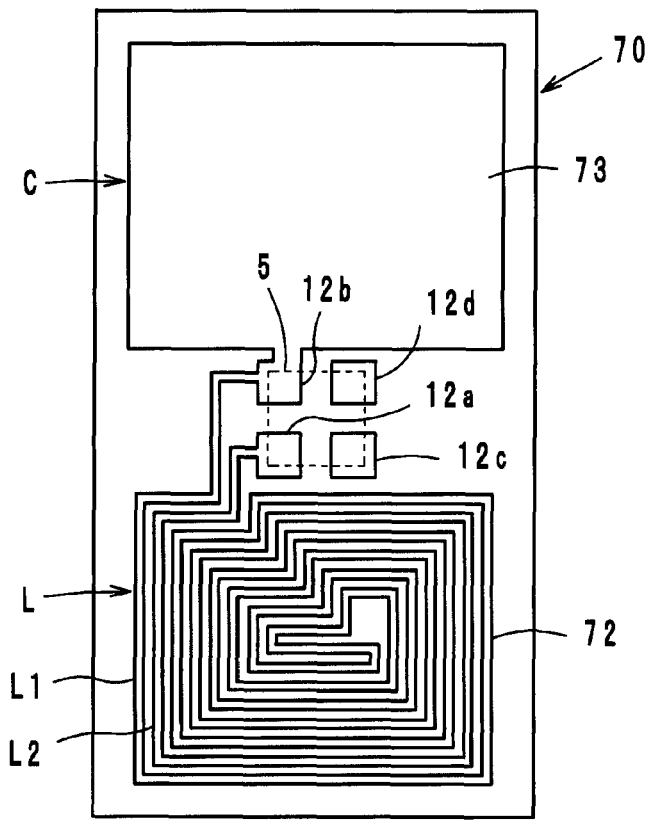
FIG. 7 is a plan view of a power supply circuit board provided with a second example of a resonant circuit.

See FIG. 7

A second example of a resonant circuit incorporated in a power supply circuit board 70 is shown in FIG. 7. The power supply circuit board 70 is made of a flexible PET film or the like. Spiral conductor patterns 72 constituting an inductance element L and a capacitor electrode 73 constituting a capacitance element C are formed on the board 70. The electrodes 12a and 12b, led out from the conductor patterns 72, and the capacitor electrode 73 are electrically connected to the terminal electrodes 6 of the wireless IC chip 5. The electrodes 12c and 12d formed on the board 70 are electrically connected to the terminal electrodes 7 of the wireless IC chip 5.

The power supply circuit board 70 is the same as that of the above-mentioned first example in that the inductance element L and the capacitance element C constitute a resonant circuit, and in that the electrodes 35a and 35b or the electrodes 36a and 36b that are opposed to each other are electrically and magnetically coupled to each other to thereby transmit/receive a high-frequency signal having a predetermined frequency. In particular, because the power supply circuit board 70 is made of a flexible film in the second example, the height of the electromagnetic coupling module 1 is reduced. Further, as for the inductance element L, its inductance value is changed by changing the line width or line interval of the conductor patterns 72, thereby enabling fine adjustment of the resonant frequency.

In the second example as well, the inductance element L is formed of the two conductor patterns 72 arranged spirally, and the two conductor patterns 72 are connected to each other at the center portion of the spiral. The two conductor patterns 72 have different inductance values L1 and L2, and different resonant frequency values can be set for the two conductor patterns 72. Thus, it is possible to widen the frequency band used in the wireless IC device, as in the above-mentioned first example.

Another Example of Electromagnetic Coupling Module

Instead of the electromagnetic coupling module having the wireless IC chip mounted on the power supply circuit board, an electromagnetic coupling module having a power supply circuit board that is provided with the function of a wireless IC may have a wireless IC and a power supply circuit formed thereon. Thus, the size and the height of the wireless IC device can be reduced.

First Preferred Embodiment

Figure 8:
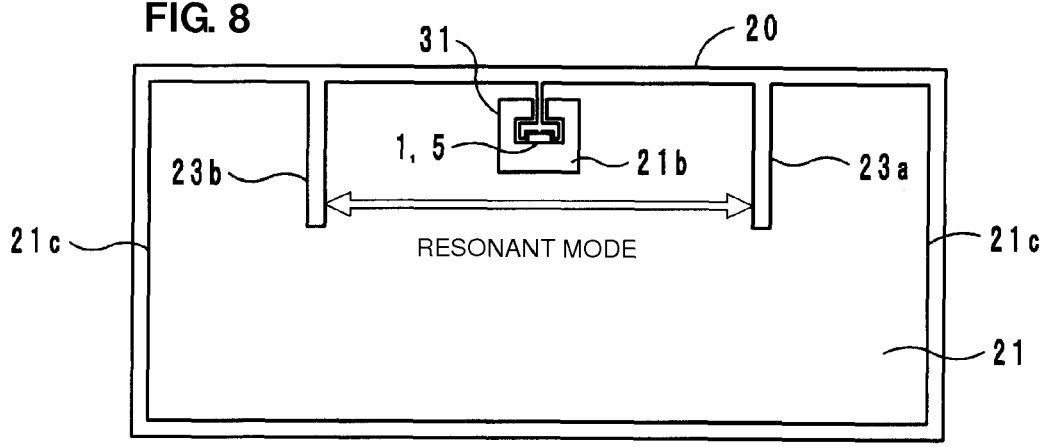
FIG. 8 is a plan view of a wireless IC device according to a first preferred embodiment.
Figure 9:
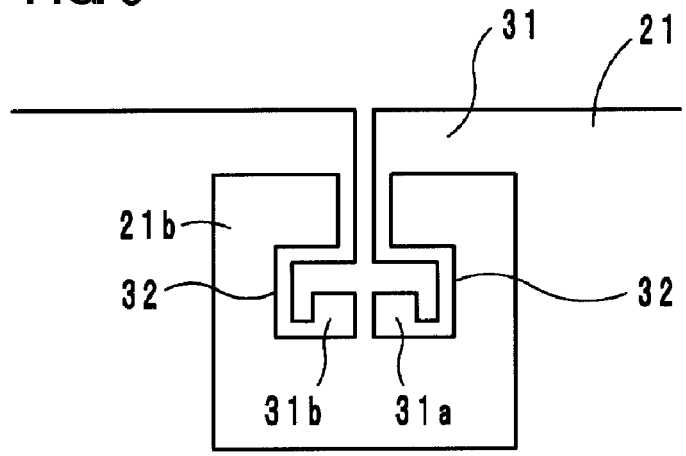
FIG. 9 is an enlarged plan view of a relevant portion of the first preferred embodiment.

See FIGS. 8 and 9

The following will describe wireless IC devices according to first to fourteenth preferred embodiments of the present invention. In these preferred embodiments, a loop electrode is formed by an opening formed in a ground electrode, as described in the above-mentioned second and fourth basic preferred embodiments (see FIGS. 3 and 5).

In the wireless IC device according to the first preferred embodiment, as shown in FIGS. 8 and 9, by forming the opening 21b at one side of the ground electrode 21 provided on the printed wiring circuit board 20, the loop electrode 31 is provided around the opening 21b, and the connecting electrodes 31a and 31b are coupled to the wireless IC chip 5 or the electromagnetic coupling module 1.

The ground electrode 21 that functions as an antenna is formed with slits 23a and 23b for adjusting the resonant frequency thereof. If the slits 23a and 23b are not formed, the ground electrode 21 resonates in a resonant mode in which both ends 21c thereof become resonance ends. In general, the size of the ground electrode 21 is determined in advance by the size of the circuit board 20. Thus, the resonant frequency in the resonant mode with the ends 21c as the resonance ends may not agree with a frequency used in an RFID system. In this case, the gain decreases. By forming the slits 23a and 23b at the side at which the wireless IC chip 5 or the electromagnetic coupling module 1 is disposed, the resonant mode can be adjusted to be short as shown in FIG. 8, and the resonant frequency is increased so as to be close to the frequency used in the RFID system. Thus, the gain is improved.

Incidentally, with reference to FIG. 1, the loop electrode 22 is used for causing the ground electrode 21 to function as an antenna, and the loop electrode 22 also has a function of impedance conversion. Specifically, the loop electrode 22 has impedance between its connecting electrodes 22a and 22b due to the loop shape. An electric current corresponding to a signal transmitted from the wireless IC chip 5 or the power supply circuit board 10 coupled to the electrodes 22a and 22b flows along the loop shape.

The impedance (Z) between the connecting electrodes 22a and 22b is expressed by the sum of a real part (R) and an imaginary part (X). Because the length of the electric current path becomes small when the shape of the loop electrode 22 becomes small, resistance (R) in the loop electrode 22 becomes small. When the length of the electric current path becomes small, the impedance $(X=\omega L)$ also becomes small because of an inductance (L) generated due to the electric. When the space for disposing the loop electrode 22 becomes small due to size reduction of an apparatus such as a cellular phone, the impedance of the loop electrode 22 becomes excessively small, and greatly differs from the impedance of the wireless IC chip and the impedance of the feeder (resonant/matching) circuit, causing a problem that sufficient electric power cannot be transferred from the wireless IC chip 5 or the power supply circuit to the radiator plate.

In order to solve this problem, the impedance (Z) of the loop electrode 22 needs to be increased, and the real part (R) or the imaginary part (X) needs to be increased. The first preferred embodiment is also intended to solve such a problem. That is, an annular matching electrode 32 is disposed inside the loop electrode 31. The length of the electric current path of the loop electrode 31 becomes great due to the matching electrode 32, the resistance (R) becomes great, and the real part (R) also becomes great, resulting in that the impedance (Z) becomes great. It is noted that the shape of the matching electrode 32 shown in FIG. 9 is one example, and may be changed to a meander shape or the like, in accordance with the shape and the size of the opening 21b.

Second Preferred Embodiment

Figure 10:
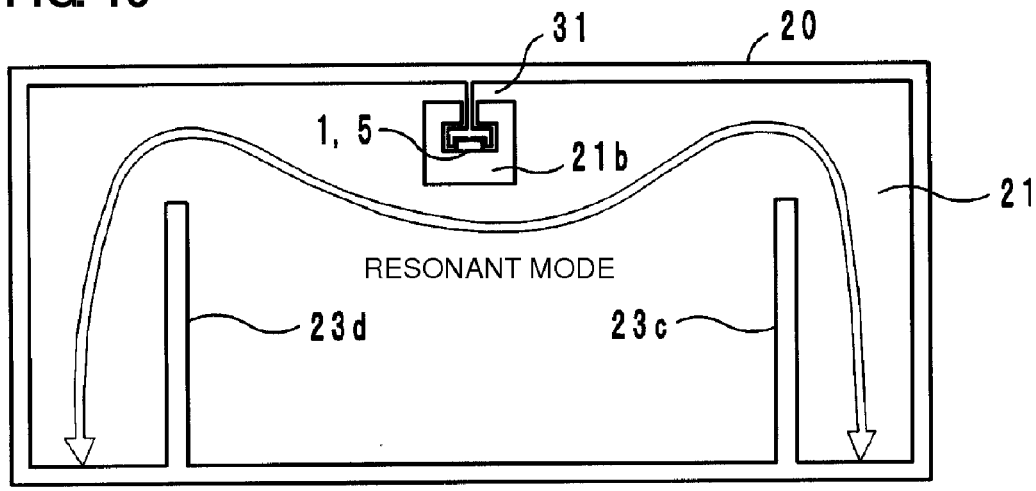
FIG. 10 is a plan view of a wireless IC device according to a second preferred embodiment.

See FIG. 10

In a wireless IC device according to a second preferred embodiment, as shown in FIG. 10, the ground electrode provided on the printed wiring circuit board 20 is formed with slits 23c and 23d for adjusting the resonant frequency thereof. By forming the slits 23c and 23d at the side opposite to the side at which the wireless IC chip 5 or the electromagnetic coupling module 1 is disposed, the resonant mode can be long, and even with the small-size ground electrode 21, the resonant frequency can be lowered so as to be close to the frequency used in the RFID system. Thus, the gain is improved.

Third Preferred Embodiment

Figure 11:
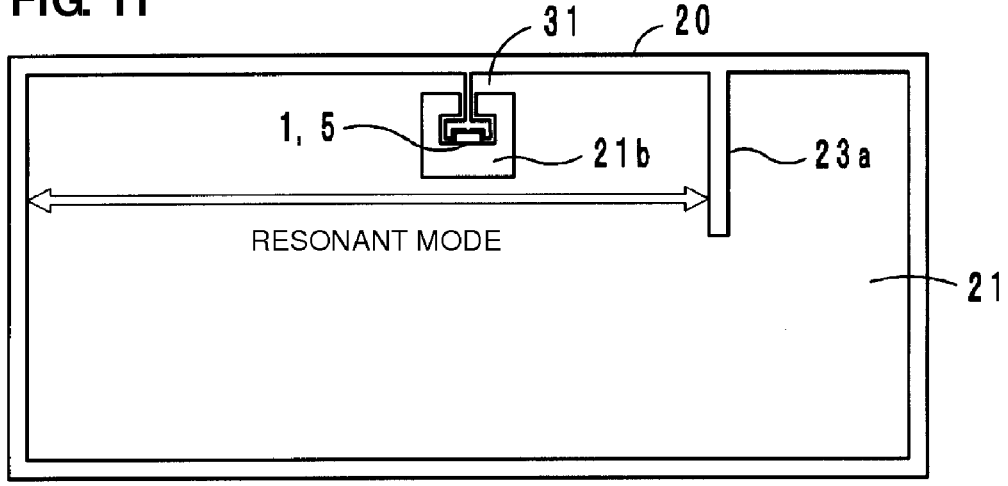
FIG. 11 is a plan view of a wireless IC device according to a third preferred embodiment.

See FIG. 11

In a wireless IC device according to a third preferred embodiment, as shown in FIG. 11, the ground electrode 21 is formed with the slit 23a. By the one slit 23a, the resonant mode can be short, and the resonant frequency can be increased so as to be close to the frequency used in the RFID system. Thus, the gain is improved.

Fourth Preferred Embodiment

Figure 12:
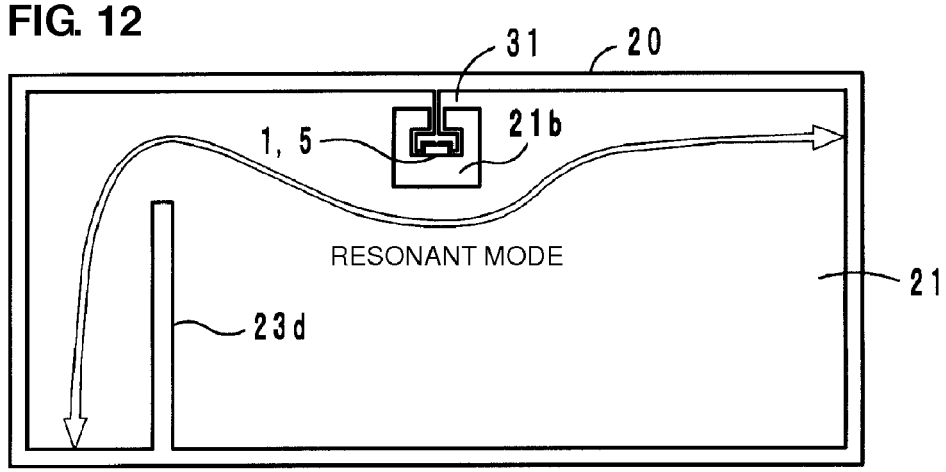
FIG. 12 is a plan view of a wireless IC device according to a fourth preferred embodiment.

See FIG. 12

In a wireless IC device according to a fourth preferred embodiment, as shown in FIG. 12, the ground electrode is formed with the slit 23d. By the one slit 23d, the resonant mode can be long, and the resonant frequency can be lowered so as to be close to the frequency used in the RFID system. Thus, the gain is improved.

Fifth Preferred Embodiment

Figure 13:
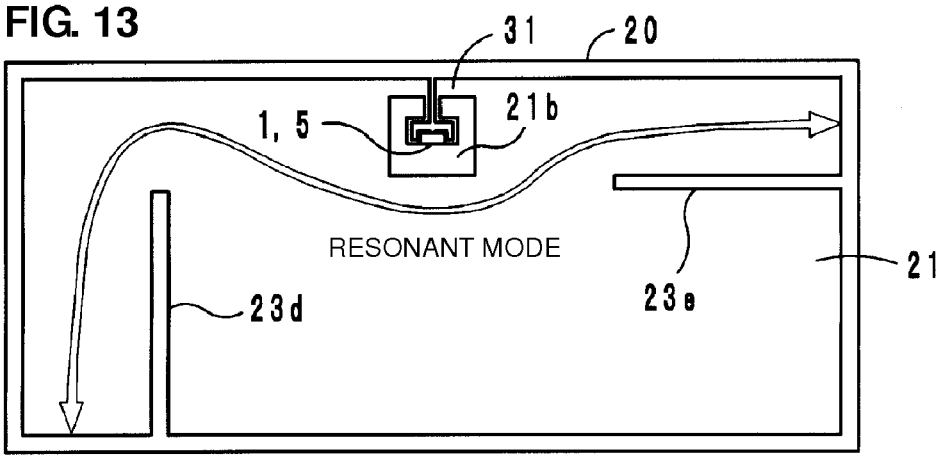
FIG. 13 is a plan view of a wireless IC device according to a fifth preferred embodiment.

See FIG. 13

In a wireless IC device according to a fifth preferred embodiment, as shown in FIG. 13, the ground electrode 21 is formed with a slit 23e in addition to the slit 23d. By so forming the slits 23d and 23e, the resonant mode can be long, and the resonant frequency can be lowered so as to be close to the frequency used in the RFID system. Thus, the gain is improved.

Sixth Preferred Embodiment

Figure 14:
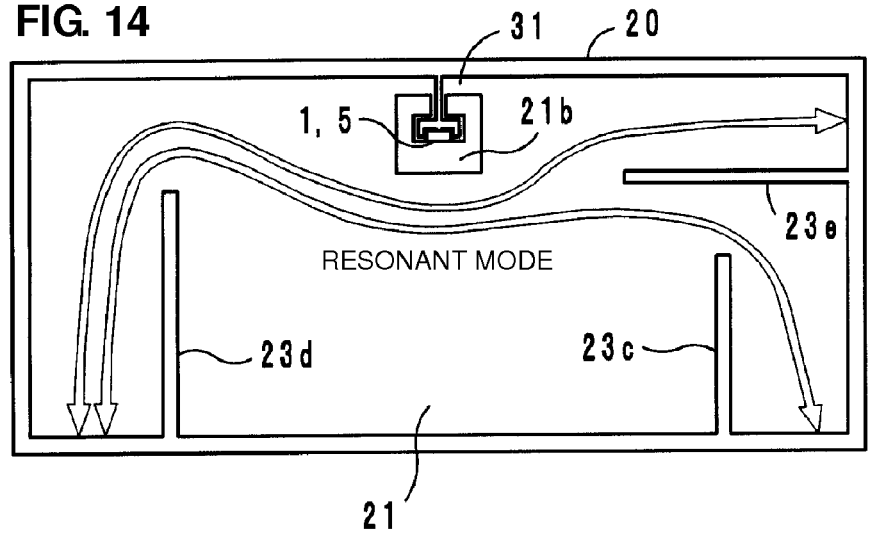
FIG. 14 is a plan view of a wireless IC device according to a sixth preferred embodiment.

See FIG. 14

In a wireless IC device according to a sixth preferred embodiment, as shown in FIG. 14, the ground electrode 21 is formed with the slits 23c, 23d, and 23e. By so forming the slits 23c, 23d, and 23e, two resonant modes can be obtained, and the ground electrode 21 has two different resonant frequencies. Thus, the gain is improved and the frequency band used is widened.

Seventh Preferred Embodiment

Figure 15:
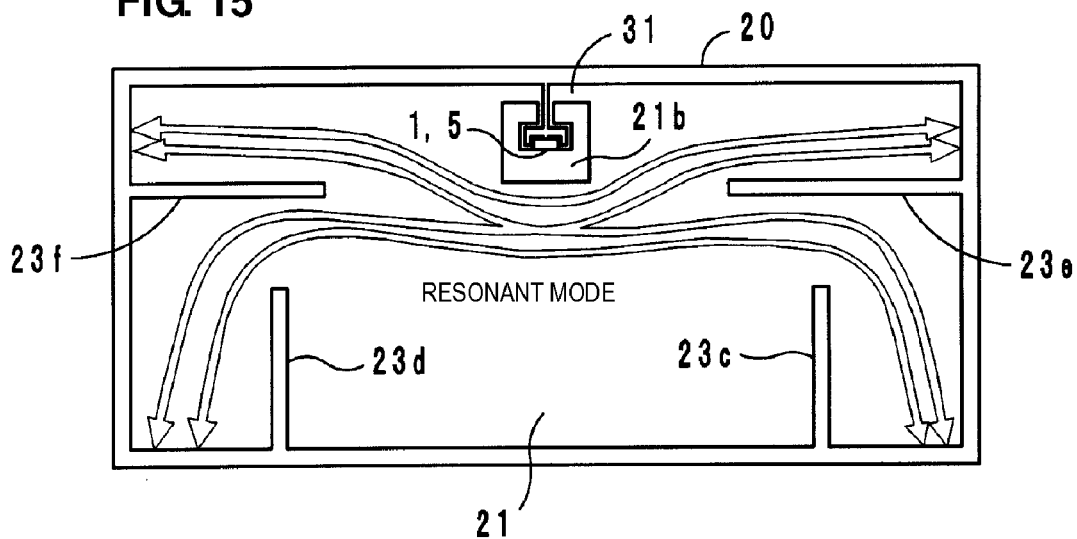
FIG. 15 is a plan view of a wireless IC device according to a seventh preferred embodiment.

See FIG. 15

In a wireless IC device according to a seventh preferred embodiment, as shown in FIG. 15, the ground electrode is formed with a slit 23f at another side thereof, in addition to the slits 23c, 23d, and 23e. By so forming the slits 23c, 23d, 23e, and 23f, four resonant modes can be obtained, and the ground electrode 21 has four different resonant frequencies. Thus, the gain is improved and the frequency band used is widened.

Eighth Preferred Embodiment

Figure 16:
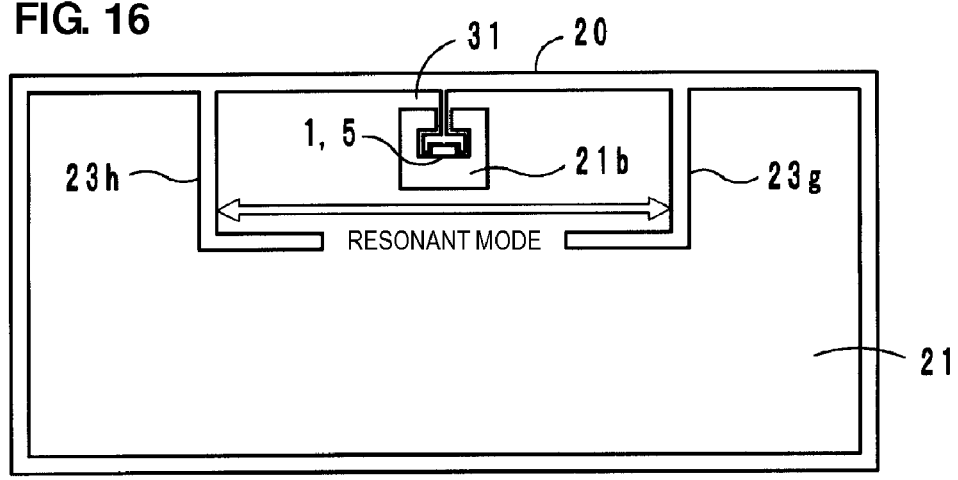
FIG. 16 is a plan view of a wireless IC device according to an eighth preferred embodiment.

See FIG. 16

In a wireless IC device according to an eighth preferred embodiment, as shown in FIG. 16, the ground electrode 21 is formed with L-shaped slits 23g and 23h at the side thereof at which the wireless IC chip 5 or the electromagnetic coupling module 1 is disposed. Thus, the resonant mode can be adjusted to be short, and the resonant frequency can be increased so as to be close to the frequency used in the RFID system, thereby improving the gain. In particular, in the eighth preferred embodiment, by forming the slits 23g and 23h in an L shape, the resonance ends are clearly defined, and a sharp resonant characteristic is obtained. In addition, reciprocal influence with wirings (not shown) disposed around the resonant part can be reduced.

Ninth Preferred Embodiment

Figure 17:
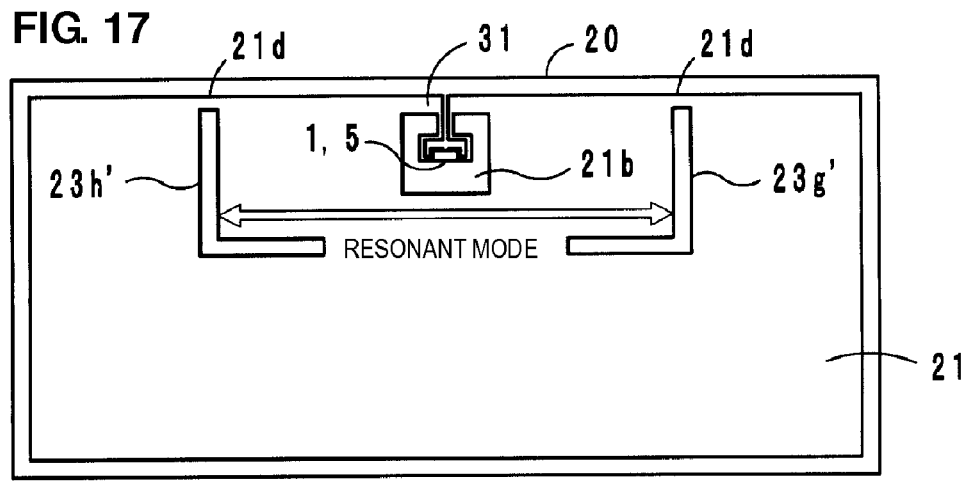
FIG. 17 is a plan view of a wireless IC device according to a ninth preferred embodiment.

See FIG. 17

In a wireless IC device according to a ninth preferred embodiment, as shown in FIG. 17, the ground electrode 21 is formed with L-shaped slits 23g' and 23h', similarly as in the above-mentioned eighth preferred embodiment, and the same effects and advantages as those in the above-mentioned eighth preferred embodiment are provided. Further, the slits 23g' and 23h' have connection parts 21d at the side of the electrode 21. The impedance at the connection parts 21d is low, and thus the effect as the ground electrode is greater than that in the above-mentioned first preferred embodiment.

Tenth Preferred Embodiment

Figure 18:
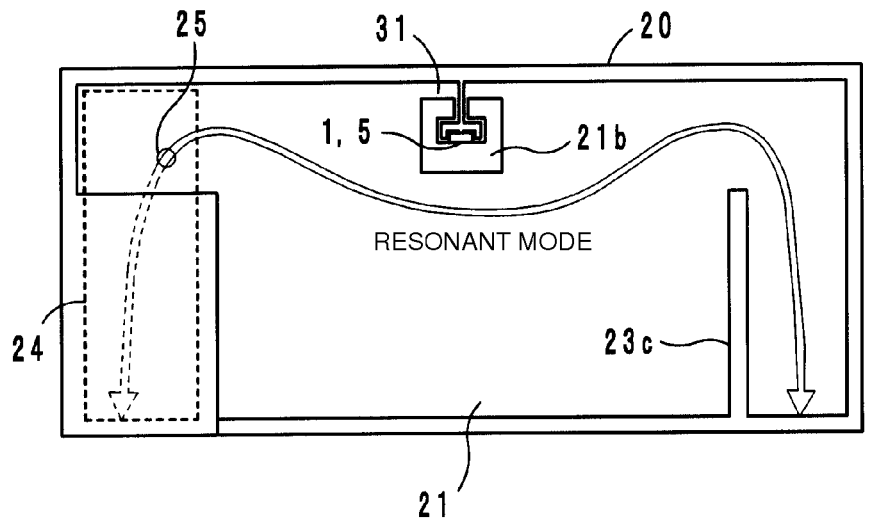
FIG. 18 is a plan view of a wireless IC device according to a tenth preferred embodiment.

See FIG. 18

In a wireless IC device according to a tenth preferred embodiment, as shown in FIG. 18, the printed wiring circuit board 20 is formed as a multilayer board, the ground electrode 21 provided on the front surface of the printed wiring circuit board 20 is formed with the slit 23c, and an end of the ground electrode 21 is electrically connected via a via-hole conductor 25 to an electrode 24 formed in an inner layer of the circuit board 20. Thus, the resonant mode can be long. In addition, because the resonant mode is set using multiple layers of the circuit board 20, flexibility in adjusting the resonant frequency is increased, and it is possible to design a complicated resonant mode.

Eleventh Preferred Embodiment

Figure 19:
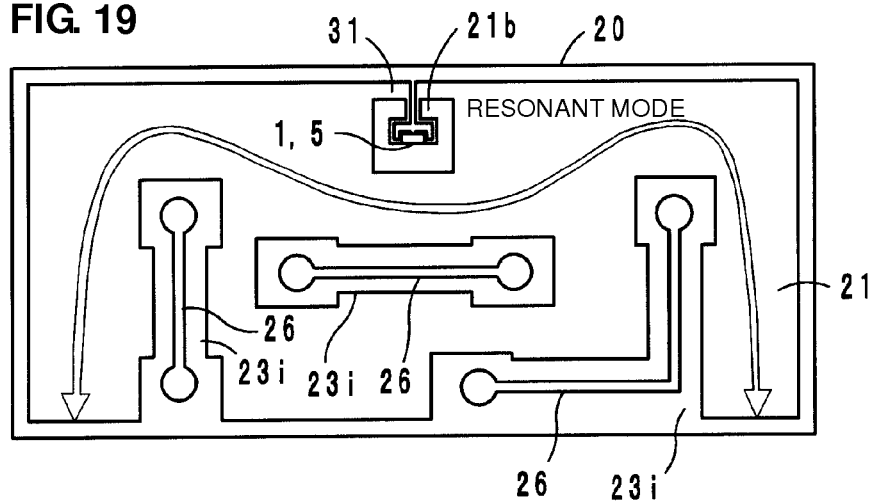
FIG. 19 is a plan view of a wireless IC device according to an eleventh preferred embodiment.

See FIG. 19

In a wireless IC device according to an eleventh preferred embodiment, as shown in FIG. 19, circuit wirings 26 are disposed in slits 23i for adjusting the resonant frequency. Even with the small-sized ground electrode 21, the resonant frequency can be adjusted to be low. In other words, in the eleventh preferred embodiment, a plurality of the slits 23i in which the circuit wirings 26 are disposed are used as slits for adjusting the resonant frequency, and there is no need to form a dedicated slit for adjusting the resonant frequency.

Twelfth Preferred Embodiment

Figure 20:
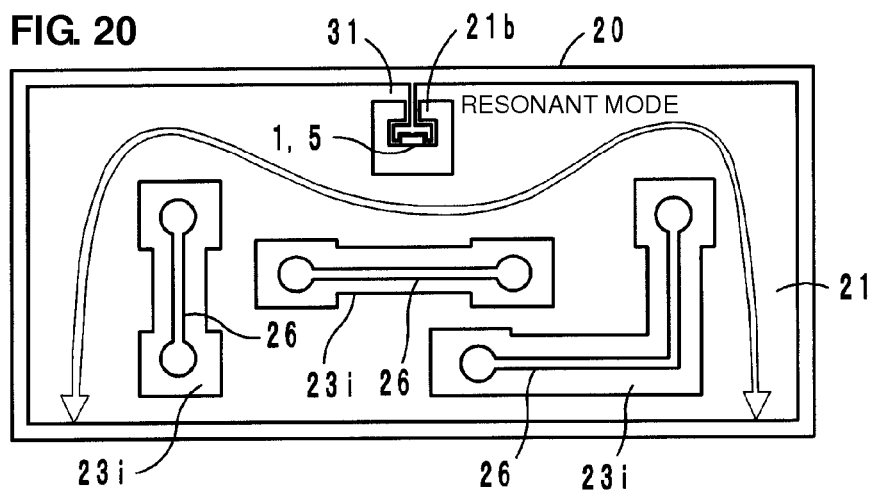
FIG. 20 is a plan view of a wireless IC device according to a twelfth preferred embodiment.

See FIG. 20

In a wireless IC device according to a twelfth preferred embodiment, as shown in FIG. 20, the slits 23i in which the circuit wirings 26 are disposed are closed inside the ground electrode 21. In the twelfth preferred embodiment, the same effects and advantages as those in the above-mentioned eleventh preferred embodiment are provided. Because all the circuit wirings 26 are surrounded by the ground electrode 21, electric stability of the circuit parts thereof improves.

Thirteenth Preferred Embodiment

Figure 21:
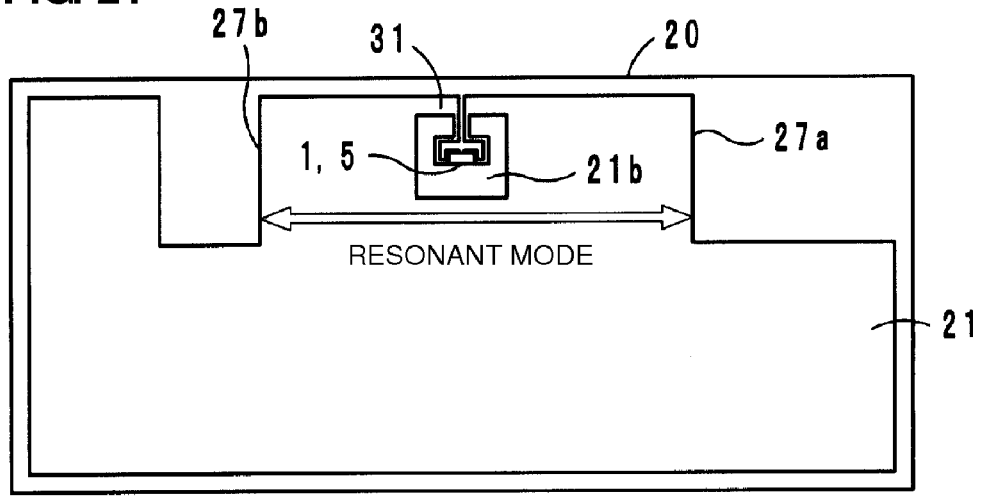
FIG. 21 is a plan view of a wireless IC device according to a thirteenth preferred embodiment.

See FIG. 21

In a wireless IC device according to a thirteenth preferred embodiment, as shown in FIG. 21, the ground electrode is formed with cutouts 27a and 27b having relatively large areas. The cutouts 27a and 27b are formed at the side at which the wireless IC chip 5 or the electromagnetic coupling module 1 is disposed, and the effects and advantages thereof are the same as those in the above-mentioned first preferred embodiment.

It is noted that the outer shape of the printed wiring circuit board 20 may be the shape corresponding to the cutouts 27a and 27b. In this case, the resonant frequency is adjusted using the outer shape of the circuit board 20. Further, as in the above-mentioned second preferred embodiment (see FIG. 10), cutouts for adjusting the resonant frequency may be formed at the side opposite to the side at which the wireless IC chip 5 or the electromagnetic coupling module 1 is disposed.

Fourteenth Preferred Embodiment

Figure 22:
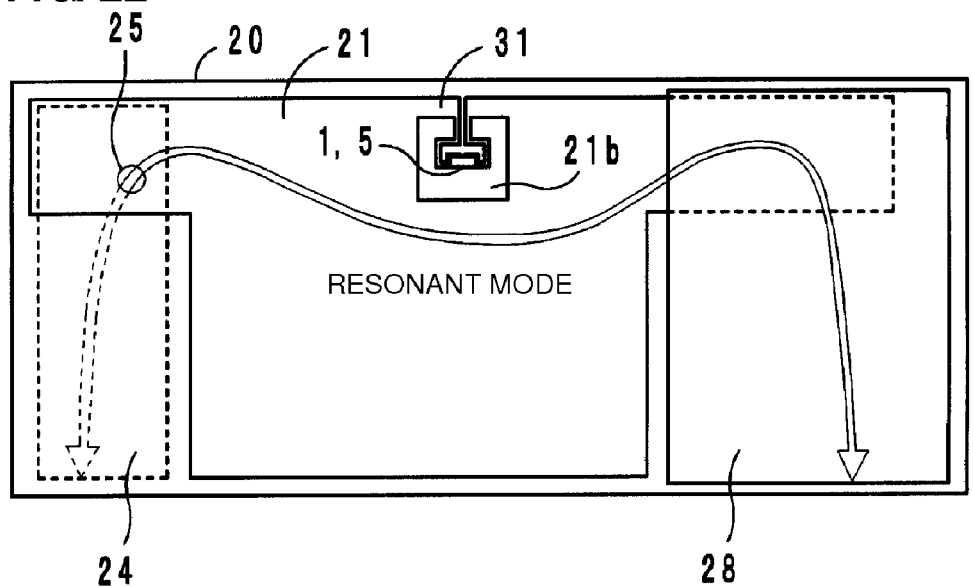
FIG. 22 is a plan view of a wireless IC device according to a fourteenth preferred embodiment.

See FIG. 22

In a wireless IC device according to a fourteenth preferred embodiment, as shown in FIG. 22, a metal member mounted on the printed wiring circuit board 20 is in a conductive state with the ground electrode 21. Specifically, a metal case 28 for electronic parts, such as a power amplifier, mounted on the circuit board 20 is electrically connected to one end of the ground electrode 21. Further, the other end of the ground electrode 21 is electrically connected via the via-hole conductor 25 to the electrode 24 formed in the inner layer of the circuit board 20, similarly as in the above-mentioned tenth preferred embodiment (see FIG. 18).

In the fourteenth preferred embodiment, a resonant mode is formed, in which an end of the electrode 24 and an end of the metal case 28 are the resonance ends. Thus, the resonant frequency is adjusted to be short.

Various Shapes of Loop Electrode, See FIGS. 23 to 28

The loop electrode can have various shapes different from the shape shown in FIG. 9. Such shapes will be described below. Of course, shapes other than the shapes shown here may be used.

Figure 23:
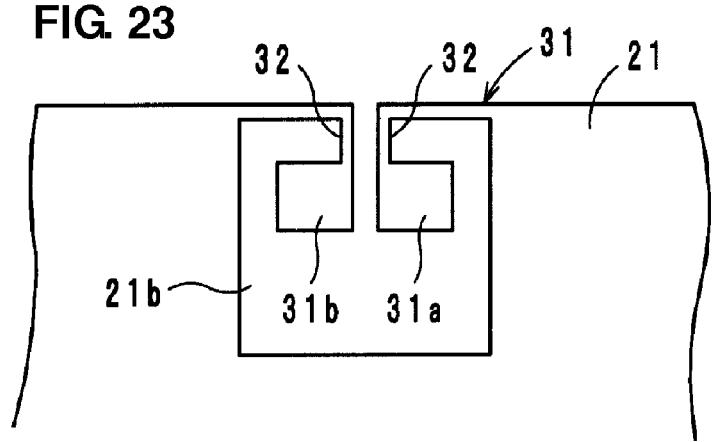
FIG. 23 is a plan view showing another example of a loop electrode.
Figure 24:
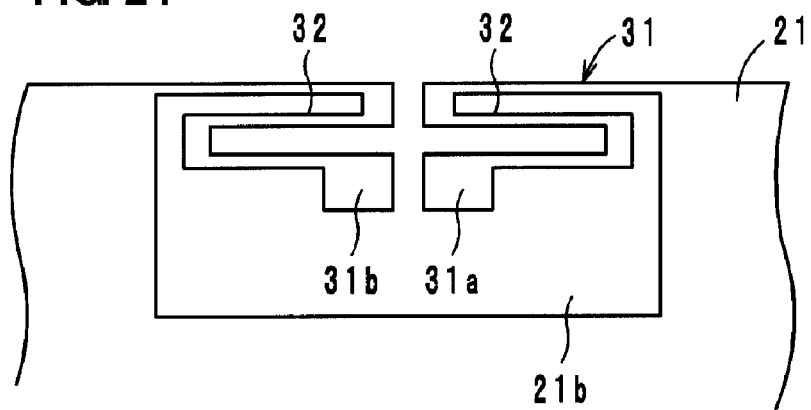
FIG. 24 is a plan view showing another example of a loop electrode.
Figure 25:
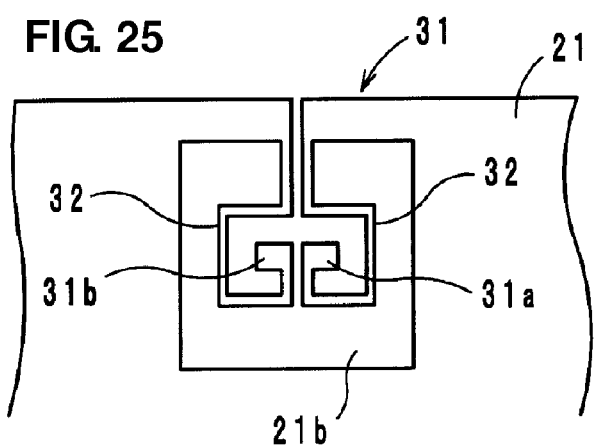
FIG. 25 is a plan view showing another example of a loop electrode.

The loop electrode 31 shown in FIG. 23 is formed with the relatively-short matching electrodes 32. The loop electrodes 31 shown in FIGS. 24 and 25 are formed with the relatively-long matching electrodes 32, and the impedance (Z) can be great as described in the above-mentioned first preferred embodiment.

Figure 26:
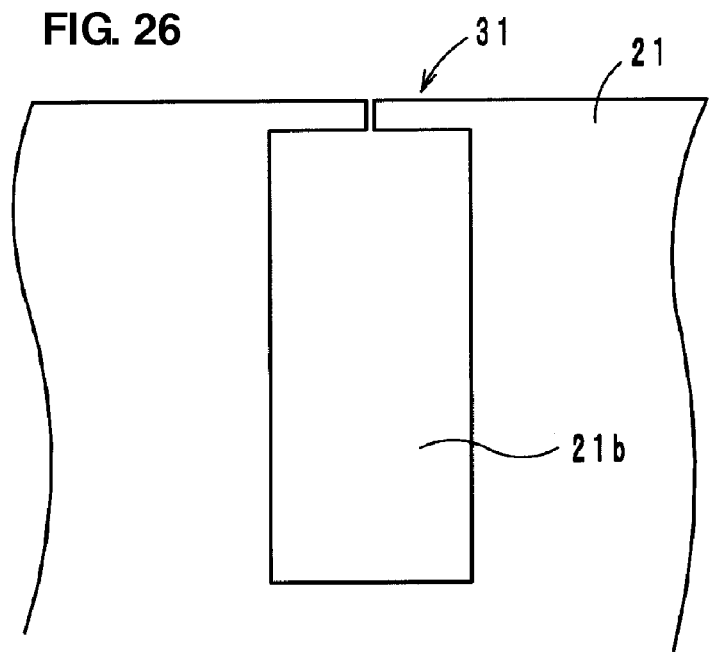
FIG. 26 is a plan view showing another example of a loop electrode.

The loop electrode 31 shown in FIG. 26 is formed with the opening 21b having a relatively large size.

Figure 27:
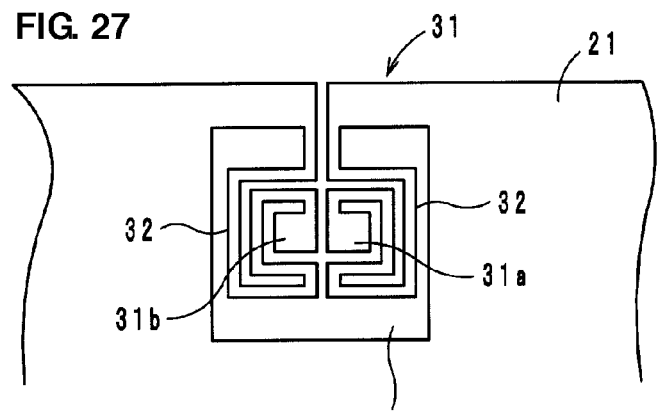
FIG. 27 is a plan view showing another example of a loop electrode.

The loop electrode 31 shown in FIG. 27 has the matching electrodes 32 arranged in a meander shape therein, and the impedance (Z) can be great.

Figure 28:
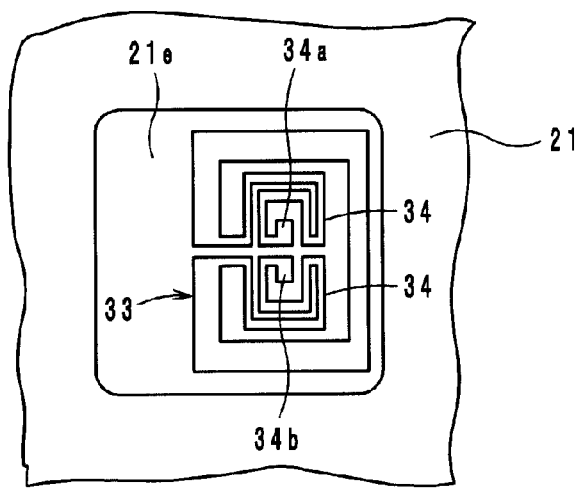
FIG. 28 is a plan view showing another example of a loop electrode.

A loop electrode 33 shown in FIG. 28 is formed in an opening 21e surrounded by the ground electrode 21, and has meander-shaped matching electrodes 34. The matching electrodes 34 have, at their ends, connecting electrodes 34a and 34b that are connected to the wireless IC chip 5 or the electromagnetic coupling module 1. The loop electrode 33 is electrically coupled to the ground electrode 21, similarly to the loop electrode 22 shown in the first basic preferred embodiment (see FIG. 1).

Fifteenth Preferred Embodiment

See FIGS. 29 to 32

Figure 29:
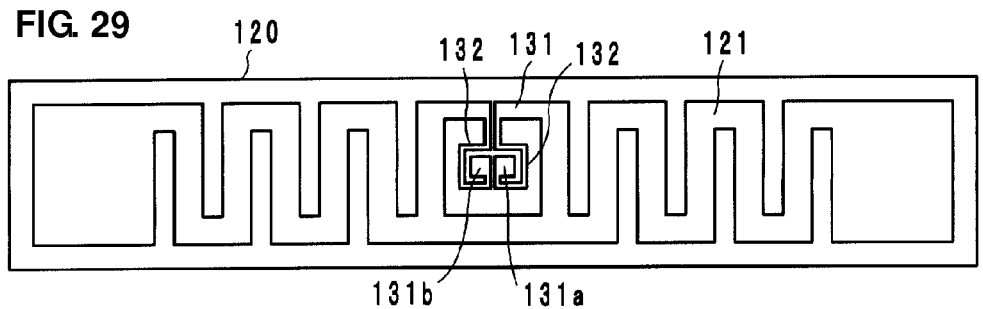
FIG. 29 is a plan view of a wireless IC device according to a fifteenth preferred embodiment.

In a wireless IC device according to a fifteenth preferred embodiment, as shown in FIG. 29, a meander-shaped electrode 121 that functions as a radiator plate is formed on the front surface of a flexible circuit board 120, and a loop electrode 131 mainly for adjusting impedance is also formed thereon. Connecting electrodes 131a and 131b are provided at ends of the loop electrode 131, and are connected to the wireless IC chip 5 or the electromagnetic coupling module 1. Between the connecting electrodes 131a and 131b and the loop electrode 131, a matching electrode 132 is formed.

Figure 30:
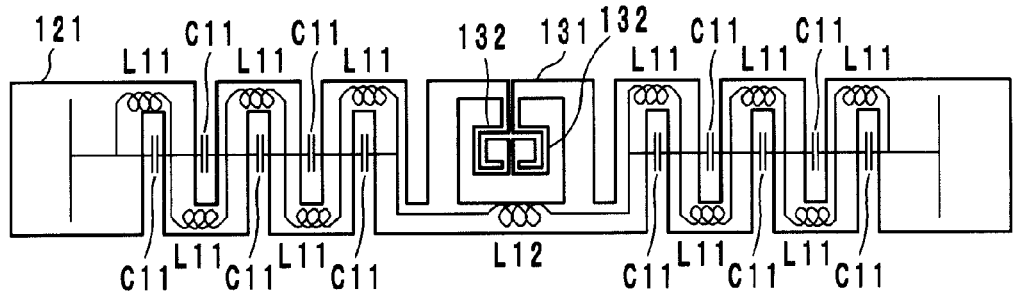
FIG. 30 is a plan view showing the fifteenth preferred embodiment together with an equivalent circuit.

In the fifteenth preferred embodiment, when the resonant frequency of the electrode 121 that functions as a radiator plate agrees with the operating frequency of the RFID system, the wireless IC device efficiently operates, and long-distance communication is possible. An equivalent circuit formed in the electrode 121 is as shown in FIG. 30. Specifically, the electrode 121 is provided with a plurality of slits so as to generate inductance components L11 and capacitance components C11 that are connected in parallel with each other, thus forming an inductance component L12 that is connected in series with the inductance components L11 and the capacitance components C11.

Figure 31:
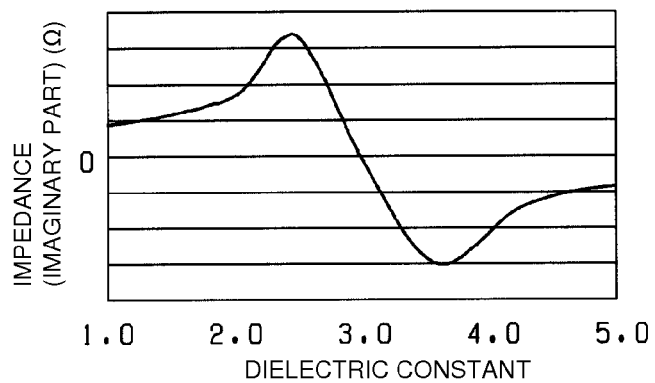
FIG. 31 is a graph showing a characteristic of the fifteenth preferred embodiment.
Figure 32:
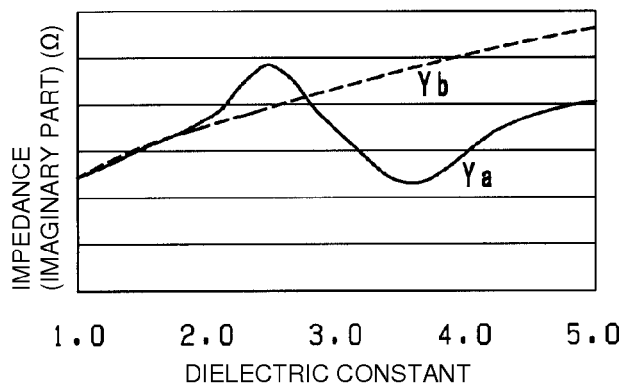
FIG. 32 is a graph showing a characteristic of the fifteenth preferred embodiment and a characteristic of a comparative preferred embodiment.

Each constant of the circuit changes according to the dielectric constant of an article to which the wireless IC device is attached. When the dielectric constant of the article is great, the inductance components and the capacitance components become great. When the inductance components L11 and the capacitance components C11 are appropriately designed, the impedance of the parallel part changes with change of the dielectric constant as shown in FIG. 31. When the impedance (imaginary part) obtained by combining the impedance of the parallel part (L11 and C11) and the impedance of the serially-connected inductance component L12 is appropriately designed, the impedance becomes substantially the same at a dielectric constant of 1 and at a dielectric constant of 3 to 4, as shown by a curve Ya in FIG. 32. In other words, changes of the impedances of L11 and C11 with the change of the dielectric constant are cancelled with each other. When an electrode in which L11 and C11 are not formed is assumed as a comparative preferred embodiment, its impedance (imaginary part) increases with increase of the dielectric constant as shown by a curve Yb in FIG. 32. Thus, the resonant frequency becomes low. On the other hand, in the fifteenth preferred embodiment, even when the dielectric constant of the attachment target article changes, the impedance (imaginary part) almost does not change, and thus the resonant frequency does not change. As described above, by forming a plurality of slits in the electrode, the resonant frequency of the electrode that functions as a radiator plate can be adjusted.

Sixteenth Preferred Embodiment

Figure 33:
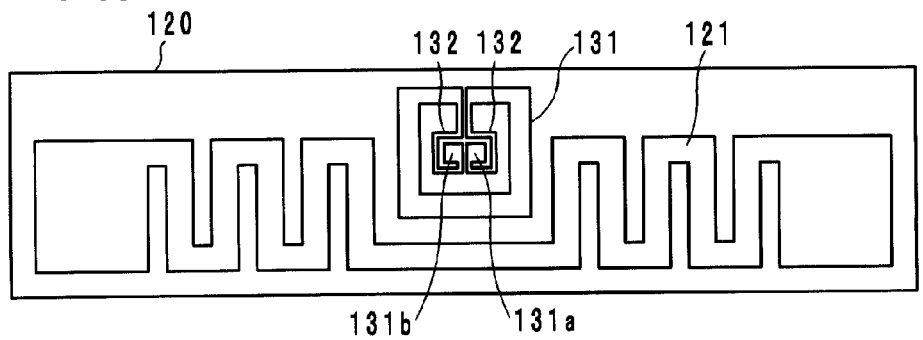
FIG. 33 is a plan view of a wireless IC device according to a sixteenth preferred embodiment.

See FIG. 33

In a wireless IC device according to a sixteenth preferred embodiment, as shown in FIG. 33, the electrode 121 and the loop electrode 131 are independently formed so as to be adjacent to each other. The electrode 121 and the loop electrode 131 are electromagnetically coupled to each other at their adjacent portions. The effects and advantages are the same as those in the above-mentioned fifteenth preferred embodiment.

Seventeenth Preferred Embodiment

Figure 34:
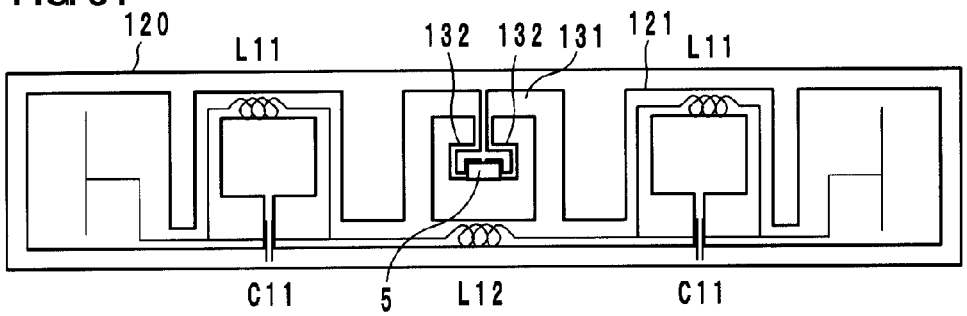
FIG. 34 is a plan view showing a wireless IC device according to a seventeenth preferred embodiment together with an equivalent circuit.

See FIG. 34

In a wireless IC device according to a seventeenth preferred embodiment, as shown in FIG. 34, portions for forming the capacitance components C11 are adjacent to each other. The effects and advantages are the same as those in the above-mentioned fifteenth preferred embodiment, and in particular, the capacitance components C11 become great. It is noted that FIG. 34 and FIG. 35 described next illustrate a state in which the wireless IC chip 5 is connected to the loop electrode 131.

Eighteenth Preferred Embodiment

Figure 35:
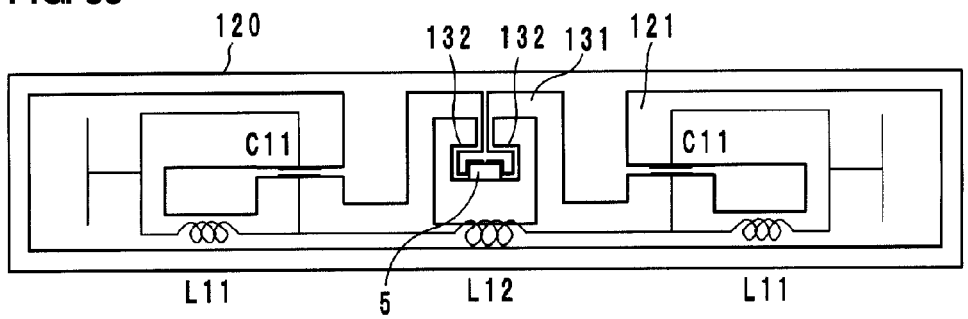
FIG. 35 is a plan view showing a wireless IC device according to an eighteenth preferred embodiment together with an equivalent circuit.

See FIG. 35

In a wireless IC device according to an eighteenth preferred embodiment, the shape is, as shown in FIG. 35, such that inductance components L11 and L12 and capacitance components C11 are formed. The effects and advantages are the same as those in the above-mentioned fifteenth preferred embodiment.

Nineteenth Preferred Embodiment

See FIGS. 36 to 39

Figure 36:
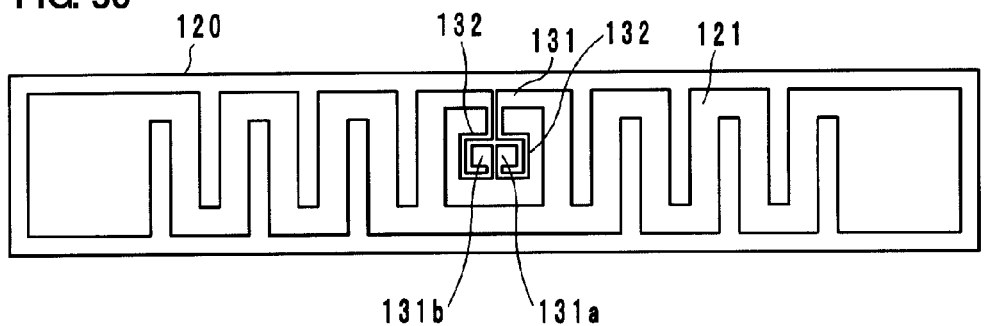
FIG. 36 is a plan view of a wireless IC device according to a nineteenth preferred embodiment.

In a wireless IC device according to a nineteenth preferred embodiment, as shown in FIG. 36, the meander-shaped electrode 121 that functions as a radiator plate is formed on the front surface of the flexible circuit board 120, and the loop electrode 131 mainly for adjusting impedance is also formed thereon. The connecting electrodes 131a and 131b are provided at the ends of the loop electrode 131, and are connected to the wireless IC chip 5 or the electromagnetic coupling module 1. Between the connecting electrodes 131a and 131b and the loop electrode 131, the matching electrode 132 is formed.

Figure 37:
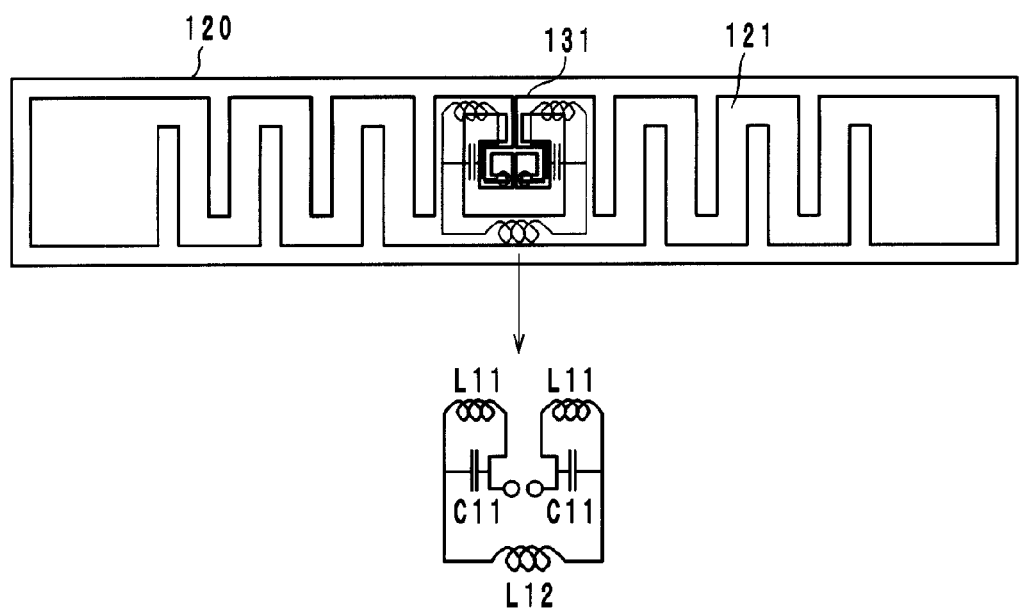
FIG. 37 is a plan view showing the nineteenth preferred embodiment together with an equivalent circuit.

In the nineteenth preferred embodiment, the imaginary part of the impedance is determined mainly by the loop electrode 131 and the matching electrode 132. For causing the wireless IC device to efficiently operate, the impedance needs to match with the wireless IC chip 5 or the electromagnetic coupling module 1. An equivalent circuit formed by the loop electrode 131 and the matching electrode 132 is as shown in FIG. 37, and includes: inductance components L11 and capacitance components C11 that are connected in parallel with each other; and an inductance component L12 that is connected in series with the inductance components L11 and the capacitance components C11.

Figure 38:
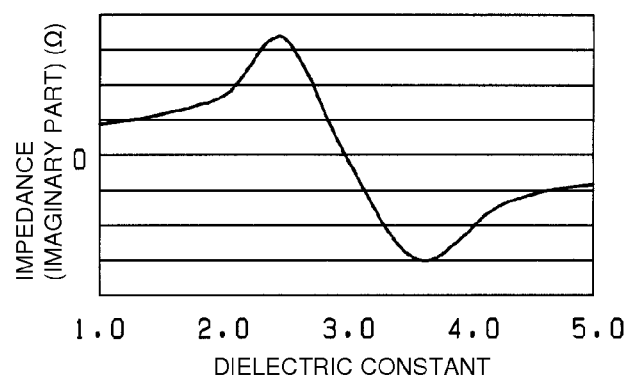
FIG. 38 is a graph showing a characteristic of the nineteenth preferred embodiment.
Figure 39:
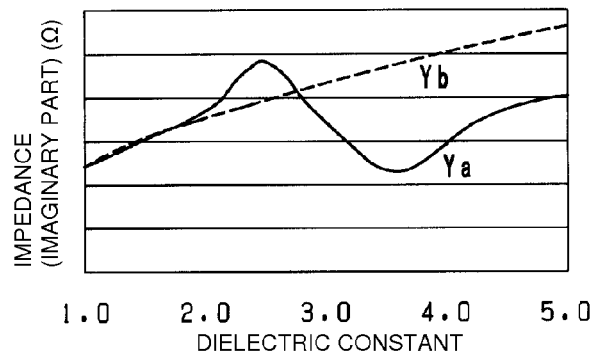
FIG. 39 is a graph showing a characteristic of the nineteenth preferred embodiment and a characteristic of a comparative preferred embodiment.

Each constant of the circuit changes according to the dielectric constant of the article to which the wireless IC device is attached. When the dielectric constant of the article is great, the inductance components and the capacitance components become great. When the inductance components L11 and the capacitance components C11 are appropriately designed, the impedance of the parallel part changes with change of the dielectric constant as shown in FIG. 38. When the impedance (imaginary part) that is obtained by combining the impedance of the parallel part (L11 and C11) and the impedance of the serially-connected inductance component L12 and that is observed from the terminal of the wireless IC chip 5 or the electromagnetic coupling module 1 is appropriately designed, the impedance becomes substantially the same at a dielectric constant of 1 and a dielectric constant of 3 to 4, as shown by a curve Ya in FIG. 39. In other words, changes of the impedances of L11 and C11 with the change of the dielectric constant are cancelled with each other. When an electrode in which L11 and C11 are not formed is assumed as a comparative preferred embodiment, the impedance (imaginary part) increases with increase of the dielectric constant as shown by a curve Yb in FIG. 39. On the other hand, in the nineteenth preferred embodiment, even when the dielectric constant of the attachment target article changes, the impedance (imaginary part) almost does not change. Thus, impedance matching is not needed in the wireless IC chip 5 or the electromagnetic coupling module 1, and a process for impedance adjustment is not needed in the wireless IC chip 5 or the electromagnetic coupling module 1.

Figure 40:
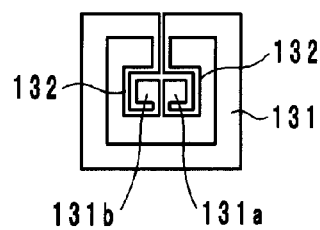
FIG. 40 is a plan view showing a modified example of a loop electrode.

It is noted that the loop electrode 131 can be used solely as shown in FIG. 40. Further, in the present preferred embodiment, the electrode is provided with a plurality of slits so as to be meander-shaped, but the electrode may have a shape of another example.

Twentieth Preferred Embodiment

Figure 41:
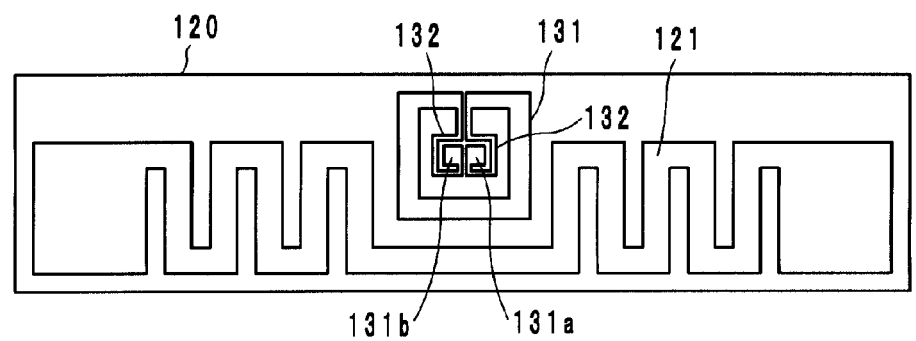
FIG. 41 is a plan view of a wireless IC device according to a twentieth preferred embodiment.

See FIG. 41

In a wireless IC device according to a twentieth preferred embodiment, as shown in FIG. 41, the electrode 121 and the loop electrode 131 are independently formed so as to be adjacent to each other. The electrode 121 and the loop electrode 131 are electromagnetically coupled to each other at their adjacent portions. The effects and advantages are the same as those in the above-mentioned nineteenth preferred embodiment.

Twenty-First Preferred Embodiment

Figure 42:
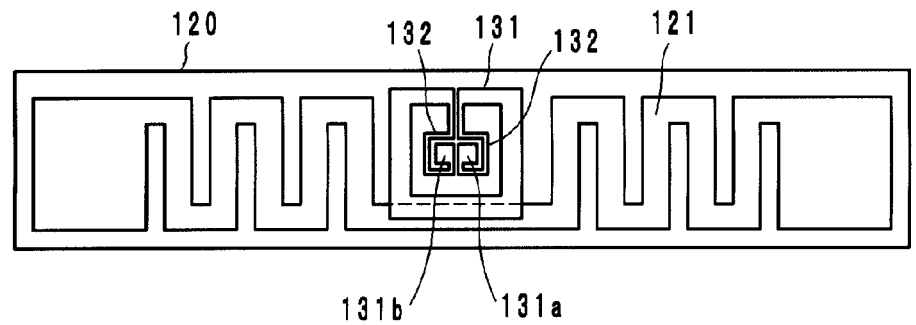
FIG. 42 is a plan view of a wireless IC device according to a twenty-first preferred embodiment.

See FIG. 42

In a wireless IC device according to a twenty-first preferred embodiment, as shown in FIG. 42, the loop electrode 131 and the electrode 121, shown in the above-mentioned twentieth preferred embodiment, are disposed so as to partially overlap each other. The electrode 121 and the loop electrode 131 are electromagnetically coupled to each other at their overlapping portions. The effects and advantages are the same as those in the above-mentioned nineteenth preferred embodiment.

Twenty-Second Preferred Embodiment

Figure 43:
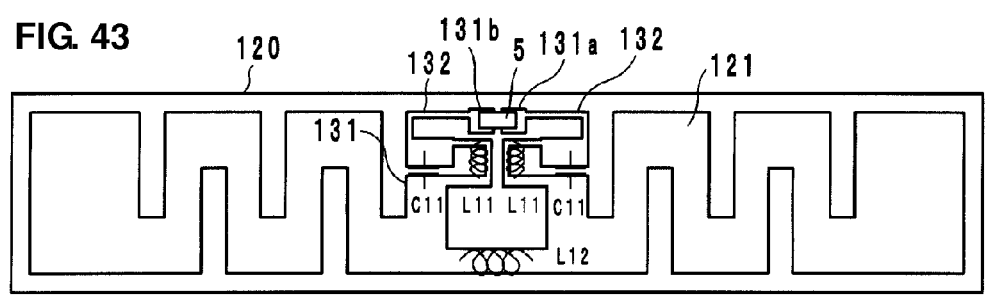
FIG. 43 is a plan view of a wireless IC device according to a twenty-second preferred embodiment together with an equivalent circuit.

See FIG. 43

In a wireless IC device according to a twenty-second preferred embodiment, as shown in FIG. 43, the inductance components L11 and capacitance components C11 that are connected in parallel with each other are formed between the loop electrode 131 and the matching electrode 132. The effects and advantages are the same as those in the above-mentioned nineteenth preferred embodiment.

Twenty-Third Preferred Embodiment

Figure 44:
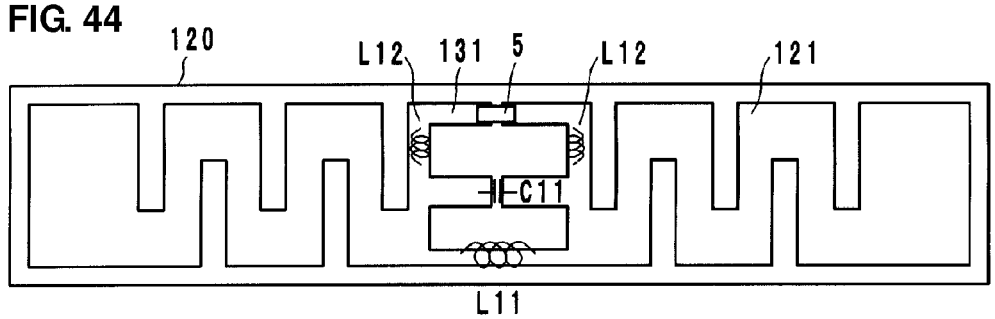
FIG. 44 is a plan view showing a twenty-third preferred embodiment of a wireless IC device together with an equivalent circuit.

See FIG. 44

In a wireless IC device according to a twenty-third preferred embodiment, as shown in FIG. 44, the capacitance component C11 is disposed at a central portion of the loop electrode 131, and cooperates with the inductance component L11 to form a parallel resonant circuit. The inductance component L12 connected in series with the parallel resonant circuit is formed at two locations. The effects and advantages are the same as those in the above-mentioned nineteenth preferred embodiment.

Twenty-Fourth Preferred Embodiment

Figure 45:
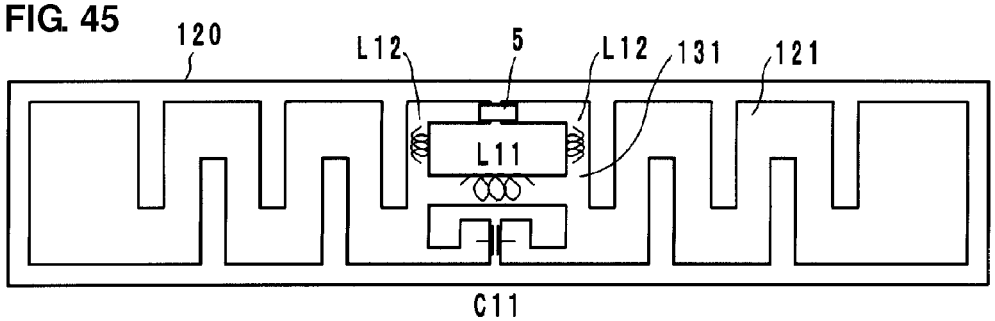
FIG. 45 is a plan view showing a wireless IC device according to a twenty-fourth preferred embodiment together with an equivalent circuit.

See FIG. 45

In a wireless IC device according to a twenty-fourth preferred embodiment, as shown in FIG. 45, the capacitance component C11 is disposed outside the loop electrode 131, and cooperates with the inductance component L11 disposed at the central portion of the loop electrode 131, to form a parallel resonant circuit. The inductance component L12 connected in series with the parallel resonant circuit is formed at two locations. The effects and advantages are the same as those in the above-mentioned nineteenth preferred embodiment.

Figure 46:
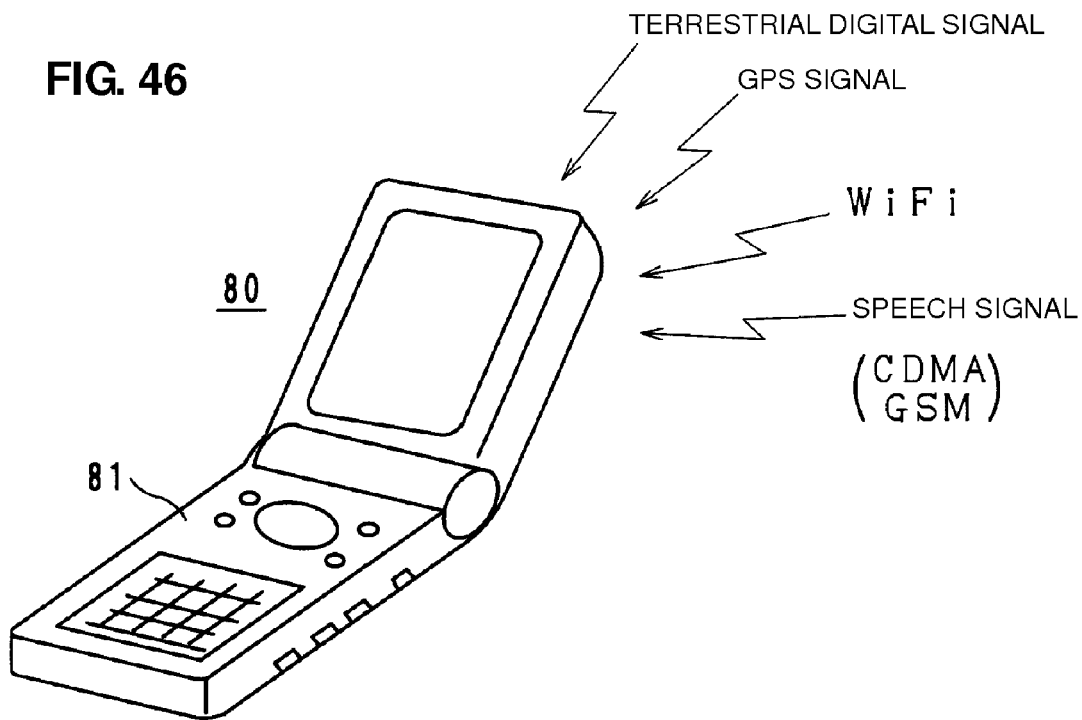
FIG. 46 is a perspective view showing a cellular phone that is one preferred embodiment of an electronic apparatus according to the present invention.
Figure 47:
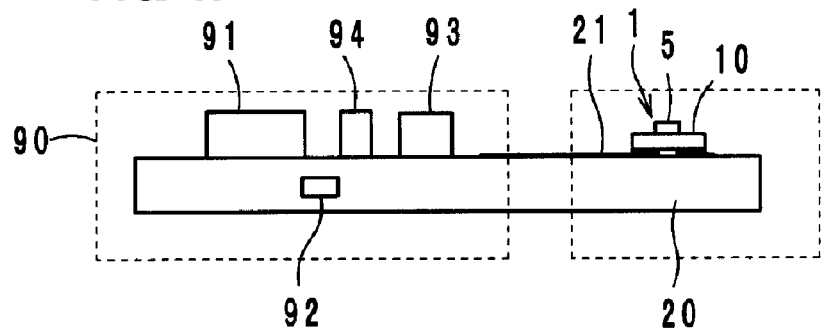
FIG. 47 is a view illustrating a printed wiring circuit board incorporated in the cellular phone.

Electronic Apparatus, See FIGS. 46 and 47

The following will describe a cellular phone that is one preferred embodiment of an electronic apparatus according to the present invention. A cellular phone 80 shown in FIG. 46 is able to handle a plurality of frequencies, and receives a terrestrial digital signal, a GPS signal, a WiFi signal, and a communication signal such as CDMA and GSM.

As shown in FIG. 47, the printed wiring circuit board is installed within a casing 81. A wireless communication circuit 90 and the electromagnetic coupling module 1 are disposed on the printed wiring circuit board 20. The wireless communication circuit 90 includes an IC 91, a balun 92 incorporated in the circuit board 20, a BPF 93, and a capacitor 94. The power supply circuit board 10 equipped with the wireless IC chip 5 is mounted on the loop electrode coupled to the ground electrode 21 provided on the printed wiring circuit board 20, thereby forming the wireless IC device.

Alternative Preferred Embodiments

It is noted that the wireless IC device, the electronic apparatus, and the method for adjusting the resonant frequency of the wireless IC device, according to the present invention, are not limited to the above-mentioned preferred embodiments, and can be modified in a variety of ways within the scope of the present invention.

For example, as an electrode for transmitting or receiving a high-frequency signal, not only the ground electrode but also various electrodes provided on the circuit board can be used. Further, resonant circuits of various configurations can be adopted as the resonant circuit. Further, the materials of the external electrode and the power supply circuit board described in the above-mentioned preferred embodiments are only examples, and any materials with necessary properties can be used.

Further, a process other than using a metal bump may be used for mounting the wireless IC chip on the power supply circuit board. Between the electrode of the wireless IC chip and the connecting electrode of the power supply circuit board, a dielectric member may be disposed such that these electrodes are capacitively coupled to each other. Further, the wireless IC chip and the loop electrode, or the power supply circuit board and the loop electrode, may be capacitively coupled to each other.

Further, the apparatus on which the wireless IC device is mounted is not limited to a wireless communication apparatus such as a cellular phone, but may be various apparatuses including a circuit board having a ground electrode (for example, household electric products such as televisions and refrigerators).

INDUSTRIAL APPLICABILITY

The present invention is useful for a wireless IC device, an electronic apparatus, and a method for adjusting a resonant frequency of a wireless IC device, and in particular, is advantageous in that miniaturization is achieved and the gain of a radiator plate (electrode) that functions as an antenna is improved without providing a dedicated antenna.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A wireless IC device comprising:
   a wireless IC chip that includes input/output terminal electrodes and processes a transmission/reception signal;
   a printed wiring circuit board on which the wireless IC chip is mounted;
   a ground electrode provided on the printed wiring circuit board; and
   a loop electrode including first and second ends and provided on the printed wiring circuit board so as to be coupled to the wireless IC chip and the ground electrode, wherein
   the loop electrode is coupled to the input/output terminal electrodes of the wireless IC chip at the first and second ends and is coupled to the ground electrode; and
   the ground electrode includes a slit and/or a cutout arranged to adjust a resonant frequency thereof.

2. A wireless IC device comprising:
   an electromagnetic coupling module including input/output terminal electrodes, a wireless IC that processes a transmission/reception signal and a power supply circuit board that includes an inductance element coupled to the wireless IC;
   a printed wiring circuit board on which the electromagnetic coupling module is mounted;
   a ground electrode provided on the printed wiring circuit board; and
   a loop electrode including first and second ends and provided on the printed wiring circuit board so as to be coupled to the power supply circuit board and the ground electrode, wherein
   the loop electrode is coupled to the input/output terminal electrodes of the electromagnetic coupling module at the first and second ends and is coupled to the ground electrode; and
   the ground electrode includes a slit and/or a cutout arranged to adjust a resonant frequency thereof.

3. The wireless IC device according to claim 1, wherein the loop electrode has an impedance matching function.

4. The wireless IC device according to claim 1, wherein the loop electrode and the ground electrode provided on the printed wiring circuit board are disposed so as to be insulated from each other.

5. The wireless IC device according to claim 1, the loop electrode and the ground electrode provided on the printed wiring circuit board are disposed so as to be electrically conductive to each other.

6. The wireless IC device according to claim 1, wherein the loop electrode is disposed around a cutout provided in the ground electrode.

7. The wireless IC device according to claim 6, further comprising a matching electrode inside the loop electrode.

8. The wireless IC device according to claim 1, wherein the slit and/or the cutout is disposed at a side at which the wireless IC chip is disposed.

9. The wireless IC device according to claim 1, wherein the slit and/or the cutout is disposed at a side opposite to a side at which the wireless IC chip is disposed.

10. The wireless IC device according to claim 1, wherein the slit and/or the cutout is disposed at a side orthogonal to a side at which the wireless IC chip is disposed.

11. The wireless IC device according to claim 1, wherein the slit has an L shape.

12. The wireless IC device according to claim 1, wherein the slit and/or the cutout includes a plurality of slits and/or cutouts arranged such that the ground electrode has a plurality of resonant frequencies.

13. The wireless IC device according to claim 1, wherein the printed wiring circuit board is a multilayer board in which multiple dielectric layers or magnetic layers are laminated.

14. The wireless IC device according to claim 13, wherein the ground electrode is disposed in multiple layers of the printed wiring circuit board.

15. The wireless IC device according to claim 1, wherein a circuit wiring is disposed in the slit and/or the cutout.

16. The wireless IC device according to claim 1, wherein a metal member mounted on the printed wiring circuit board is in a conductive state with the ground electrode.

17. The wireless IC device according to claim 1, wherein the ground electrode includes an inductance component and a capacitance component that are connected in parallel with each other, and another inductance component that is connected in series with the inductance component and the capacitance component.

18. The wireless IC device according to claim 1, further comprising a matching electrode, wherein
   the loop electrode and the matching electrode include an inductance component and a capacitance component that are connected in parallel with each other, and another inductance component that is connected in series with the inductance component and the capacitance component.

19. An electronic apparatus comprising the wireless IC device according to claim 1.

20. A method for adjusting a resonant frequency of a wireless IC device that includes: a wireless IC chip that includes input/output terminal electrodes and processes a transmission/reception signal; a printed wiring circuit board on which the wireless IC chip is mounted; a ground electrode provided on the printed wiring circuit board; and a loop electrode including first and second ends and provided on the printed wiring circuit board so as to be coupled to the wireless IC chip and the ground electrode, wherein the loop electrode is coupled to the input/output terminal electrodes of the wireless IC chip at the first and second ends and is coupled to the ground electrode, the method comprising the step of:

adjusting the resonant frequency by forming a slit and/or a cutout in the ground electrode.

21. A method for adjusting a resonant frequency of a wireless IC device that includes: an electromagnetic coupling module including input/output terminal electrodes, a wireless IC that processes a transmission/reception signal and a power supply circuit board that includes an inductance element coupled to the wireless IC; a printed wiring circuit board on which the electromagnetic coupling module is mounted; a ground electrode provided on the printed wiring circuit board; and a loop electrode including first and second ends and provided on the printed wiring circuit board so as to be coupled to the power supply circuit board and the ground electrode, wherein the loop electrode is coupled to the input/output terminal electrodes of the electromagnetic coupling module at the first and second ends and is coupled to the ground electrode, the method comprising the step of:

adjusting the resonant frequency by forming a slit and/or a cutout in the ground electrode.

22. The method according to claim 20, wherein by forming a slit and/or a cutout in the ground electrode, an inductance component and a capacitance component that are connected in parallel with each other are formed and another inductance component that is connected in series with the inductance component and the capacitance component is formed to adjust the resonant frequency.

\* \* \* \* \*